United States Patent
Jeong et al.

(10) Patent No.: US 6,582,982 B2
(45) Date of Patent: *Jun. 24, 2003

(54) COMPOSITION FOR WIRING, A WIRING USING THE COMPOSITION, MANUFACTURING METHOD THEREOF, A DISPLAY USING THE WIRING AND A MANUFACTURING METHOD THEREOF

(75) Inventors: Chang-Oh Jeong, Incheon-si (KR); Yang-Sun Kim, Kyungki-do (KR); Myung-Koo Hur, Kyungki-do (KR); Young-Jae Tak, Kyungki-do (KR); Mun-Pyo Hong, Kyungki-do (KR); Chi-Woo Kim, Seoul (KR); Jang-Soo Kim, Kyungki-do (KR); Chun-Gi You, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/962,210

(22) Filed: Sep. 26, 2001

(65) Prior Publication Data

US 2002/0013021 A1 Jan. 31, 2002

Related U.S. Application Data

(60) Division of application No. 09/031,486, filed on Feb. 26, 1998, now Pat. No. 6,337,520, which is a continuation-in-part of application No. 09/031,445, filed on Feb. 26, 1998, now Pat. No. 6,081,308.

(30) Foreign Application Priority Data

Feb. 26, 1997 (KR) .................................. 1997-5979
Aug. 26, 1997 (KR) .................................. 1997-40653
Sep. 19, 1997 (KR) .................................. 1997-47729
Sep. 19, 1997 (KR) .................................. 1997-47730
Sep. 19, 1997 (KR) .................................. 1997-47731

(51) Int. Cl.[7] ..................... H01L 21/00; H01L 21/82; H01L 21/44

(52) U.S. Cl. .................. 438/30; 438/48; 438/128; 438/683; 438/685

(58) Field of Search ..................... 438/30, 48, 128, 438/683, 685, 118, 158, 159, 160, 592, 652, 622, 648, 649

(56) References Cited

U.S. PATENT DOCUMENTS 4,533,935 A    8/1985   Mochizuki .................. 357/51
4,556,897 A   12/1985   Yorikane et al. ............ 357/71

(List continued on next page.)

FOREIGN PATENT DOCUMENTS

JP    405088199 A   *  4/1993
JP    405144833 A   *  6/1993

(List continued on next page.)

*Primary Examiner*—Matthew Smith
*Assistant Examiner*—Chuong A Luu
(74) *Attorney, Agent, or Firm*—Volentine Francos, PLLC

(57) ABSTRACT

The Mo or MoW composition layer has a low resistivity of less than 15 $\mu\Omega cm$ and is etched to have a smooth taper angle using an Al alloy enchant or a Cr enchant, and the Mo or MoW layer is used for a wiring of a display or a semiconductor display along with an Al layer or a Cr layer. Since the Mo or MoW layer can be deposited so as to give low stress to the substrate by adjusting the deposition pressure, a single MoW layer can be used as a wiring by itself. When contact holes are formed in the passivation layer or the gate insulating layer, a lateral etch is reduced by using polymer layer, an etch gas system using $CF_4+O_2$ can prevent the etch of the Mo or MoW alloy layer, and an etch gas of $SF_6+HCl$ (+He) or $SF_6+Cl_2$ (+He) can form the edge profile of contact holes to be smoothed. Also, when an amorphous silicon layer formed under the Mo or MoW layer is etched using the Mo or MoW layer as a mask, using an etch gas system that employs a gas such as hydrogen halide and at least one gas selected from $CF_4$, $CHF_3$, $CHClF_2$, $CH_3F$, and $C_2F_6$, yields good TFT characteristics, and $H_2$ plasma treatment can further improve the TFT characteristics.

23 Claims, 24 Drawing Sheets

U.S. PATENT DOCUMENTS

| | | | |
|---|---|---|---|
| 4,970,574 A | | 11/1990 | Tsunenari .................... 357/71 |
| 5,132,756 A | | 7/1992 | Matsuda .................... 357/23.1 |
| 5,516,712 A | | 5/1996 | Wei et al. .................... 437/40 |
| 5,543,946 A | | 8/1996 | Enomoto et al. ............. 359/87 |
| 5,614,728 A | * | 3/1997 | Akiyama .................... 257/57 |
| 5,670,062 A | | 9/1997 | Lin et al. .................... 216/108 |
| 5,756,372 A | * | 5/1998 | Wakui et al. ................. 438/30 |
| 5,811,835 A | | 9/1998 | Seiki et al. ................... 257/57 |
| 5,821,622 A | | 10/1998 | Tsuji et al. ................. 257/763 |
| 5,912,506 A | | 6/1999 | Colgan et al. .............. 257/750 |
| 5,978,061 A | | 11/1999 | Miyazaki et al. ........... 349/155 |
| 5,998,229 A | | 12/1999 | Lyu et al. .................... 438/30 |
| 6,081,308 A | * | 6/2000 | Jeong et al. .................. 349/42 |
| 6,150,199 A | * | 11/2000 | Whitten et al. ............. 438/128 |
| 6,156,652 A | * | 12/2000 | Mlchalicek ................ 438/674 |

FOREIGN PATENT DOCUMENTS

| | | | |
|---|---|---|---|
| JP | 405259382 A | * | 10/1993 |
| JP | 406077482 A | * | 3/1994 |
| JP | 406082831 A | * | 3/1994 |

* cited by examiner

| MoW content (atm%) | Cl2+SF6 | HCl+SF6 |
|---|---|---|
| 0% | 200Å/min | 150Å/min |
| 0% ~ 10% | 243Å/min | 261Å/min |
| 10% ~ 20% | 592Å/min | 280Å/min |
| 20% ~ 30% | 604Å/min | 313Å/min |

FIG.28

| MoW content (atm%) | HCL+CF4 |
|---|---|
| 0% | 17Å/min |
| 0% – 10% | 20Å/min |
| 10% – 20% | 80Å/min |
| 20% – 30% | 50Å/min |

COMPOSITION FOR WIRING, A WIRING USING THE COMPOSITION, MANUFACTURING METHOD THEREOF, A DISPLAY USING THE WIRING AND A MANUFACTURING METHOD THEREOF

RELATED APPLICATIONS

This application is a divisional of U.S. patent application Ser. No. 09/031,486, filed on Feb. 26, 1998, now U.S. Pat. No. 6,337,520, which is a continuation-in-part of application Ser. No. 09/031,485, filed Feb. 26, 1998, now U.S. Pat. No. 6,081,308, which is hereby incorporated by reference in its entirety.

BACKGROUND OF THE INVENTION (1) Field of the Invention

The present invention relates to a composition for a wiring, a wiring using the composition, a manufacturing method thereof, and a display using the wiring and a manufacturing method thereof.

(2) Description of the Related Art

Generally, wirings of semiconductor devices or displays are designed to transmit signals without delay and not to be easily opened.

In order to prevent the opening of wirings, it is suggested that the wirings have a multi-layered structure. However, this structure requires several etch process steps using different etchants.

In order to prevent delay or distortion of signals, materials having low resistivity such as aluminum or aluminum alloy are generally used. However, since the physical or chemical properties of the aluminum or aluminum alloy are not good, that is, the aluminum or aluminum alloy is easily oxidized and easily broken, process steps for compensating for the poor physical properties such as anodic oxidation process are required. Furthermore, there is a problem that the contact property between aluminum or aluminum alloy and ITO, e.g. when used for a transparent electrode of a liquid crystal display, is bad.

In the meantime, wirings for a liquid crystal become narrow since liquid crystal display are moving to a higher resolution. However, since the wiring should have limited resistance, the thickness of the wiring becomes larger. Therefore, the wiring gives large stress to a substrate for a liquid crystal display, and the stress becomes larger as the size of the substrate becomes larger.

SUMMARY OF THE INVENTION

In view of the above, it is an object of the present invention to provide a material or composition for wiring which has low resistivity and gives low stress to a substrate for a liquid crystal display.

It is another object of the present invention to provide a dual-layered wiring which can be easily manufactured.

Another object of the present invention is to simplify the manufacturing process of a display by using the dual-layered wiring and to improve its quality.

It is another object of the present invention to smooth the edge profile of contact holes exposing conductive layer or metal wiring.

Another object of the present invention is to prevent the consumption of a conductive layer under contact holes during formation of the contact holes.

A wiring according to the present invention has a dual-layered structure having a taper angle in the range of 20~70° when manufactured under one etching condition. Otherwise, a wiring has an upper layer and a lower layer, wherein the upper conductive layer of the wiring has etch rate larger than that of the lower conductive layer by 70 to 100 Å/sec.

When the wiring is etched by wet etch, only one etchant may be used for etching the two layers.

One of the conductive layers included in the wiring may be made of a material having a low resistivity equal to or less than 15 $\mu\Omega$cm, and the other conductive layer may be made of a pad material. A pad material means a material which can be used as a pad. The detailed description for a pad material is given in the detailed description.

An aluminum layer or an aluminum alloy layer may be used for one of the conductive layers. In the case of using an aluminum alloy layer, it is preferable that the aluminum alloy includes aluminum and both/either a transition metal and/or a rare earth metal less than 5%.

The other conductive layer may be made of MoW alloy including 0.01 to less than 20 atm % tungsten, the rest of molybdenum and inevitable impurities. It is preferable that the MoW alloy includes tungsten of 9 to 11 atm %.

When using aluminum as one of the conductive layers, an etchant for aluminum or aluminum alloy such as $CH_3COOH/HNO_3/H_3PO_4/H_2O$ can be used for etching the wiring. It is preferable that the concentration of $HNO_3$ is 8 to 14%.

The wiring having a dual-layered structure can be used as a gate line or a data line for transmitting a scanning signal or a data signal in a display.

In a method for manufacturing the dual-layered wiring, a lower conductive layer is deposited on a substrate, and an upper conductive layer whose etch rate is larger than that of the lower conductive layer by 70 to 100 Å/sec under the same etching condition is deposited on the lower conductive layer. The upper and the lower conductive layers are patterned to form a wiring under the etching condition, for example, using one etchant. When the wiring has a pad for receiving signals from outside and the lower conductive layer is made of a pad material, the portion of the upper conductive layer at the pad may be removed to expose the lower conductive layer.

Accordingly, a composition of MoW for a wiring comprises 0.01 to less than 20 atm % of tungsten, the rest of molybdenum and inevitable impurities. It is preferable to comprise 9 to 11 atm % of tungsten.

A single layer of the above composition can be also used as a wiring, because it has a resistivity in the range of 12 to 14 $\mu\Omega$m and is suitable for a pad. It is preferable that a edge slope of the wiring is formed in the range between 20–70°, more preferably 40–50°. The wiring can be used as a gate line or a data line of a display.

It is needless to say that the layer of this composition along with another conductive layer is used as an wiring.

A thin film transistor (hereafter referred to as a TFT) substrate according to the present invention includes a gate pattern including a gate pad, a gate electrode and a gate line which are made of a MoW layer including 0.01 to less than 20 atm % tungsten, the rest of molybdenum and inevitable impurities formed on a substrate. It is preferable that the MoW layer comprises 9 to 11 atm % of tungsten.

The gate pad, the gate electrode and the gate line may further include a conductive layer made of an aluminum or an aluminum alloy formed on or under the MoW layer. In this case, the conductive layer is simultaneously patterned along with the MoW layer using one etchant. In case of using aluminum alloy, the aluminum alloy includes aluminum and both/either transition metal and/or a rare earth metal less than 5%. $CH_3COOH/HNO_3/H_3PO_4/H_2O$ may be used as an etchant. It is preferable that the density of $HNO_3$ is 8 to 14%.

The TFT substrate further includes a data pattern including a source electrode, a drain electrode and a data line of the TFT substrate. The data pattern may include a single layer made from one material selected from a chromium, a molybdenum and a MoW alloy. Otherwise, they may have a dual-layered structure which includes two layers made of either two selected from a chromium, a molybdenum and a MoW alloy or MoW and either aluminum or an aluminum alloy. When aluminum and aluminum alloy is used for an upper layer, it is desirable to remove the portion of the aluminum layer or the aluminum alloy layer at a pad.

When the data pattern includes a lower conductive layer of chromium and an upper layer of MoW, the upper and the lower layers are patterned under one etching condition.

The two layers are wet-etched using an etchant for chromium such as $HNO_3/(NH_4)_2Ce(NO_3)_6/H_2O$. It is preferable that the concentration of $HNO_3$ is 4 to 10% and the concentration of $(NH_4)_2Ce(NO_3)_6$ is 10 to 15%.

A single layer of Mo or MoW may be also used the signal line of the large scale and high resolution liquid display, because the Mo or MoW layer gives less stress to a substrate made of a material such as glass than other conductive layers.

In a manufacturing method of a display according to the present invention, a photoresist pattern is formed on a insulating layer on a conductive layer or metal wiring and the photoresist pattern is used as a mask for forming contact holes in a thin portion and a thick portion of the insulating layer. At this time, it is preferable to form contact holes through two steps or three steps, in order to smooth the edge profile of contact holes and in order to prevent the consumption of the conductive layer under the contact holes.

In the two-step process, the first step is to etch the photoresist pattern and the insulating layer in part under the condition that etch rate of the photoresist pattern and the insulating layer is in the range between 1:1 to 1:1.5. At this time, the insulating layer and the portion of the conductive layer under the thin portion of the insulating layer may be slightly etched. Thereafter, second etching step is performed under the condition that etch rate of the insulating layer is larger than that of the conductive layer by equal to or more than 15 times.

In the three-step process, the first step is to etch insulating layer to expose a portion of the conductive layer under the thin portion of the insulating layer. Thereafter, a polymer layer is formed on the exposed surface. Finally, etching step is performed under the condition that the etch rate of the insulating layer is more than 15 times larger than the conductive layer. Here, the polymer layer prevents the lateral etching of the insulating layer.

The above method is applied to a structure including a first metal layer, a first insulating layer, a second metal layer and a second insulating layer, sequentially. That is, this method is applied to simultaneously forming a first contact hole exposing the second metal layer under the second insulating layer and a second contact hole exposing the first metal layer under the second and the first insulating layer.

This method is applied to forming contact holes exposing pads for receiving signals from outside of semiconductor device or display, in particular, simultaneously exposing gate pad and data pad.

Particularly, when using Mo or MoW for the conductive layer and silicon nitride for the insulating layer, it is preferable that the insulating layers are plasma dry-etched by using a gas system such as $CF_4+O_2$ in the final step in order to minimize the consumption of the conductive layer. In addition, it is preferable that plasma dry etch gas system in the first step is $SF_6+HCl$ (+He) or $SF_6+Cl_2$ (+He) in order to smooth the edge profile of the contact holes.

When using $CF_4+O_2$ gas system, it is preferable that $O_2$ is less than 4/10 with respect to $CF_4$, in order to simultaneously expose gate pad and data pad of Mo or MoW through one etch step.

The amorphous silicon TFT may also include a doped amorphous silicon layer as well as an amorphous silicon layer, and this doped amorphous silicon layer is dry-etched using a mask of the data pattern. Here, because the data pattern of Mo or MoW is easily dry-etched, it is preferable to select a dry-etching gas system having etch rate less than 100 Å/sec for MoW. Hydrogen halide and at least one selected from $CF_4$, $CHF_3$, $CHClF_2$, $CH_3F$ and $C_2F_6$ is suitable for this purpose.

BRIEF DESCRIPTION OF THE DRAWINGS

FIG. 28 is a graph illustrating etch rate of MoW for dry-etch gas in the seven experiment of manufacturing method according to the first embodiment of the present invention.

DETAILED DESCRIPTION OF THE PREFERRED EMBODIMENTS

Preferred embodiments of the present invention are described with reference to the accompanying drawings.

A wiring of a semiconductor device, especially of a display, is made of a material which has a low resistivity, i.e., less than 15 $\mu\Omega$cm, such as aluminum, aluminum alloy, molybdenum, copper, and so on. This wiring generally includes a pad for receiving external electrical signals from outside. The pad should not be easily opened during manufacturing processes, and should not be oxidized when exposed to air. Aluminum or aluminum alloy has a very low resistivity, but it is not suitable for a pad because it is easily opened and easily oxidized. On the contrary, chromium, tantalum, titanium, molybdenum, and their alloys are suitable for a pad, but they have larger resistivity than aluminum. Accordingly, it is desirable that a wiring be made of either a material having both properties or of dual conductive layers consisting of a first conductive layer having a low resistivity and a second conductive layer for a pad.

When the wiring is formed of dual layers, it is desirable that the layers are etched under the same etching condition, in particular, by using the same etchant and tapering it to have a slanted profile.

In particular, either the wiring should have a taper angle in the range of 20°–70° or an upper conductive layer of the wiring has an etch rate larger than the lower conductive layer by 70 to 100 Å/sec for the same etchant. Furthermore, in the case of a singular-layered wiring, it is desirable that the wiring have a taper angle in the range in 20°~70°.

A composition of a Mo—W compound comprising tungsten of 0.01 to less than 20 atomic percentage (atm %), with the rest being molybdenum and inevitable impurities is developed for a wiring. In this case, it is preferable that the MoW compound comprise tungsten of 5 to 15 atm %, more preferably, 9 to 11 atm %.

Figure 1:
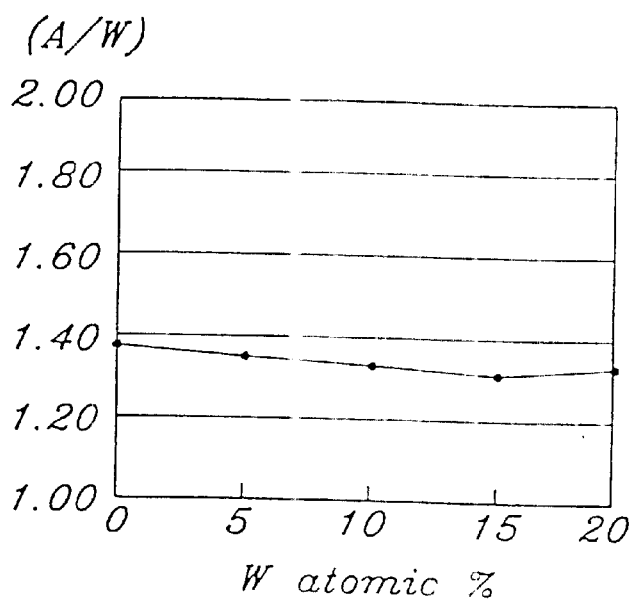
FIGS. 1–3 show graphs of the characteristics of a MoW layer according to an embodiment of the present invention.
Figure 2:
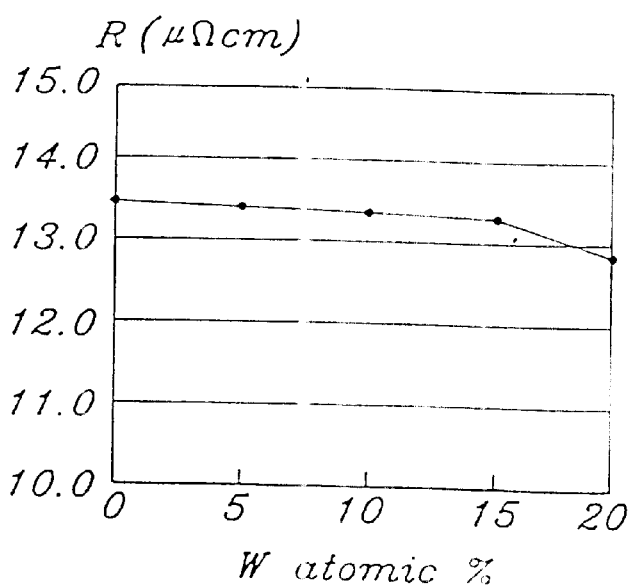
Figure 3:
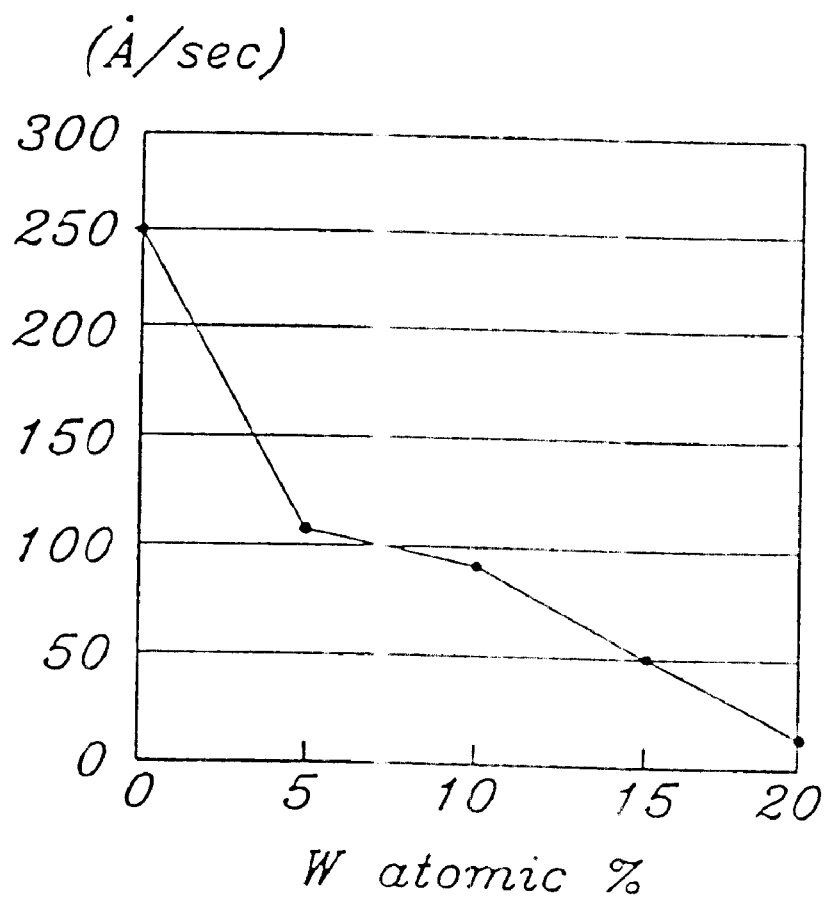

FIGS. 1–3 are graphs showing the characteristics of MoW according to an embodiment of the present invention.

FIG. 1 shows a deposition characteristic of a MoW layer. The horizontal axis indicates a tungsten content in atm %, and the vertical axis indicates deposited thickness per unit power.

As shown in FIG. 1, the deposited thickness of the MoW layer is in the range of 1.20 to 1.40 Å/W.

FIG. 2 shows a resistivity of a MoW alloy according to an embodiment of the present invention, as a function of tungsten content in atm %.

As shown in FIG. 2, the resistivity of the MoW alloy including tungsten content less than 20 atm % is in the range of 12.0 to 14.0 $\mu\Omega$cm.

Since the MoW alloy has a resistivity less than 15 $\mu\Omega$cm as well as a pad property, can be used as a singular wiring layer. It is needless to say that it can also be used for a dual-layered wiring along with a layer of aluminum or aluminum alloy. The wiring can also be used as a signal line such as a gate line or a data line of a liquid crystal display.

FIG. 3 shows etch rate characteristics of Mo or MoW alloy layers according to an embodiment of the present invention, where an etch rate of a MoW alloy layer in Å/sec for an etchant for aluminum is shown as a function of tungsten content in atm %. The etchant used for this embodiment is an aluminum etchant, $CH_3COOH/HNO_3/H_3PO_4/H_2O$.

As shown in FIG. 3, the etch rate of the pure Mo layer is as high as 250 Å/sec, but the etch rate of a MoW alloy layer including tungsten of 5 atm % is 100 Å/sec. Its etch rate when including tungsten of 15 to 20 atm % is less than 50 Å/sec.

Since a thin layer of an aluminum or an aluminum alloy has an etch rate in the range of 40–80 Å/sec for $CH_3COOH/HNO_3/H_3PO_4/H_2O$ including $HNO_3$ of 8–14%, the molybdenum alloy layer having an etch rate larger than an aluminum layer or an aluminum alloy layer by 70–100 Å/sec is selected to be used for a dual-layered wiring along with the aluminum or aluminum alloy layer.

Figure 4:
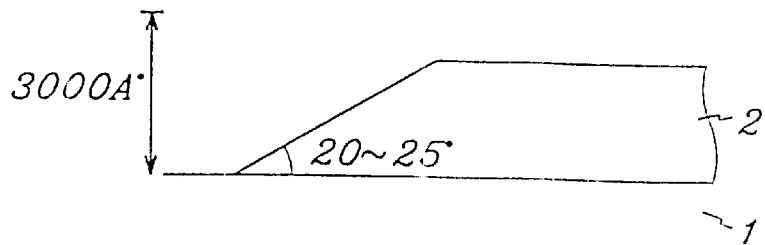
FIG. 4 is a sectional view of a MoW layer according to an embodiment of the present invention.

FIG. 4 is a sectional view of a MoW alloy layer etched by an aluminum etchant according to an embodiment of the present invention.

A molybdenum alloy comprising tungsten of 10 atm % is deposited to thickness of 3,000 Å and etched by an aluminum etchant.

Then, as shown in FIG. 4, a single MoW layer has a taper angle of 20°–25°.

In reference to FIG. 3, the etch rate of the molybdenum alloy can be less than 100 Å/sec by adjusting the tungsten content. Then, a taper angle of a single layer made from the molybdenum alloy can be formed in the range of 30–90°. Accordingly, it can be used as a wiring for a gate line and a data line of a liquid crystal display.

FIGS. 5–8 are sectional views of a dual-layered wiring made of a MoW alloy layer and an aluminum alloy layer according to an embodiment of the present invention.

As shown in FIGS. 5–8, an Al layer or an Al alloy layer 3 with thickness of 2,000 is deposited on a substrate 1, and a MoW alloy layer 2 is deposited to thickness of 1,000 on the Al layer 3. The Al alloy layer 3 and the MoW alloy layer 2 are sequentially etched by an Al etchant $CH_3COOH/HNO_3/H_3PO_4/H_2O$, preferably comprising $HNO_3$ of 8~14%.

Here, the aluminum alloy includes aluminum and a transition metal, such as Ni, Cu, Zr, Nb, Mo, Pd, Hf, Ta or W, or a rare earth metal such as Nd, Gd, Dy, or Er of less than atm 5%.

Figure 5:
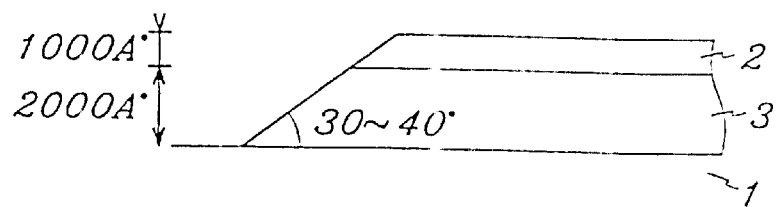
FIGS. 5–8 are sectional views of a dual-layered wiring made of a MoW layer and an aluminum alloy layer according to an embodiment of the present invention.
Figure 6:
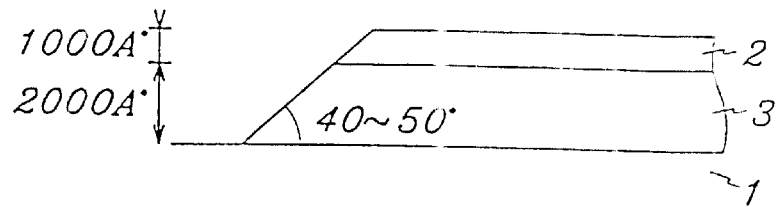
Figure 7:
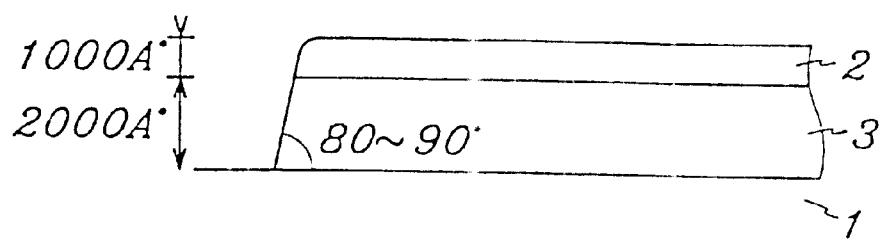
Figure 8:
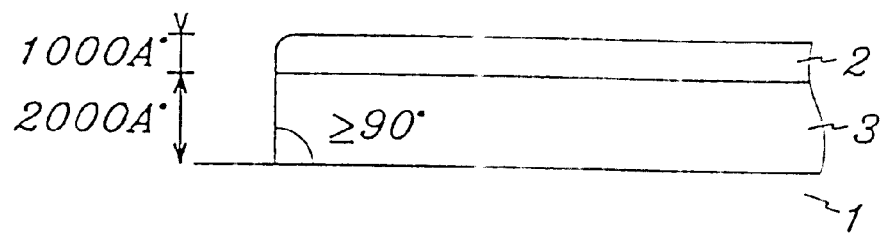

When MoW includes 5 atm % tungsten, the taper angle is in the range of 30–40° as shown in FIG. 5, and when MoW includes 10 atm % tungsten, the taper angle is in the range of 40–50° as shown in FIG. 6. When MoW includes 15 atm % tungsten, the taper angle is in the range of 80–90° as shown in FIG. 7, and when MoW includes 20 atm % tungsten, the taper angle is larger than 90° as shown in FIG. 8.

In addition, there was no spot on the substrate and wiring.

Accordingly, the taper angle of a MoW layer including less than 20% tungsten is in the range of 30°–90° and increases as the tungsten content increases. As shown in FIG. 6, a desirable taper angle, 40~50° is formed when the tungsten content is in the range of 9~11 atm %.

A structure of a TFT substrate using a wiring including a MoW layer will now be described specifically with reference to FIGS. 9A, 9B and 10.

Figure 9A:
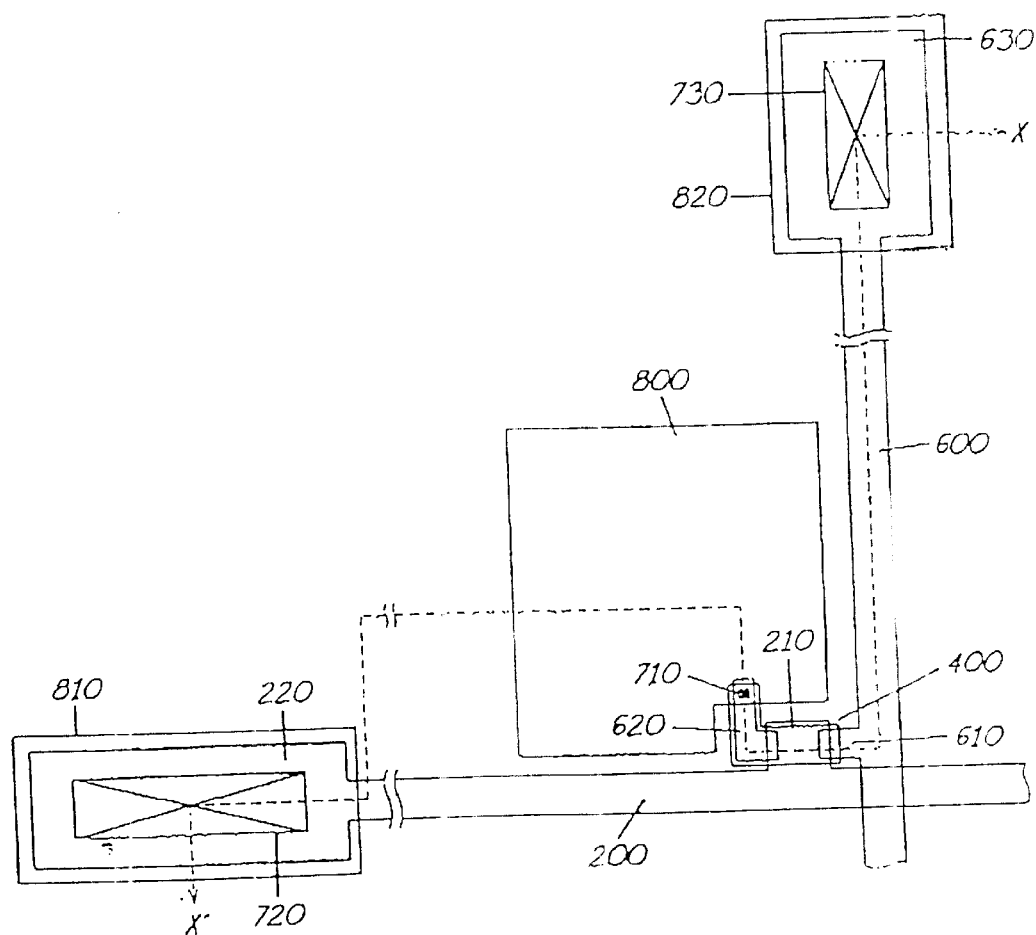
FIGS. 9A and 9B are layout views of a TFT substrate according to an embodiment of the present invention.
Figure 9B:
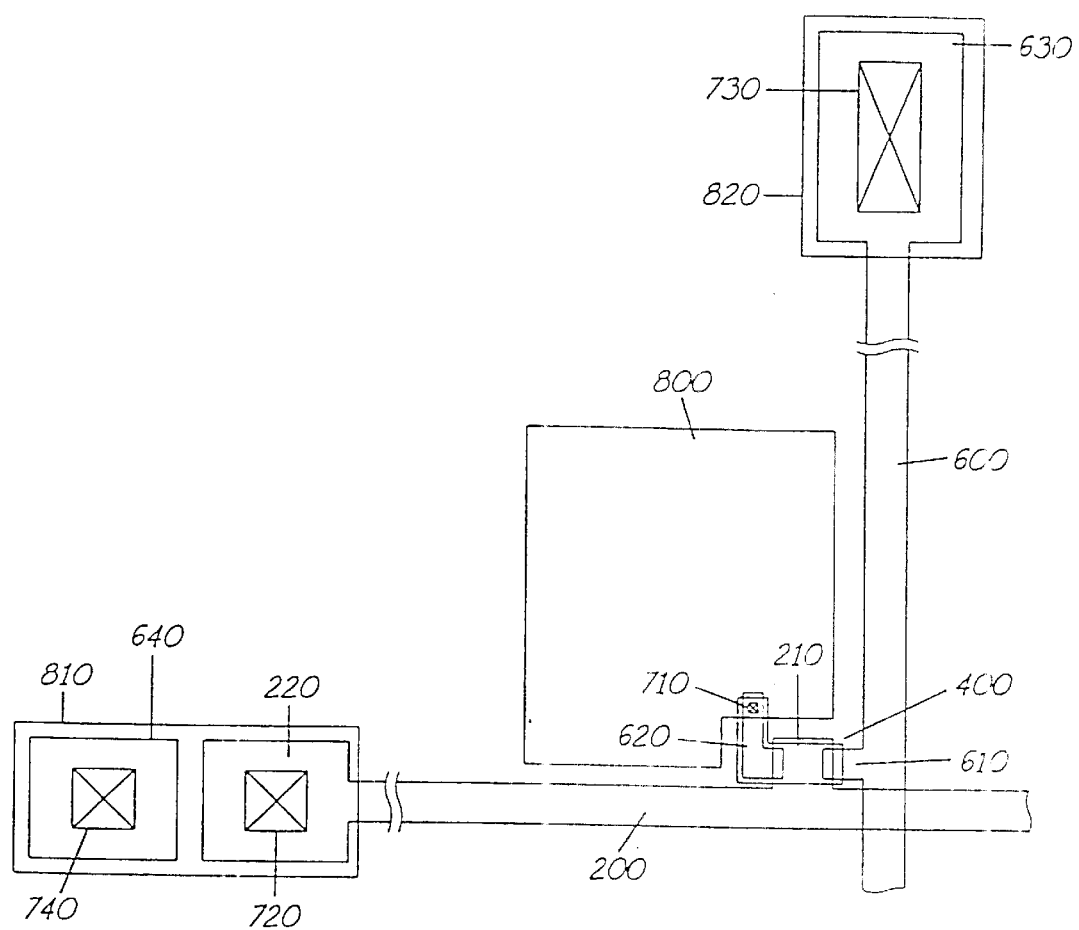
Figure 10:
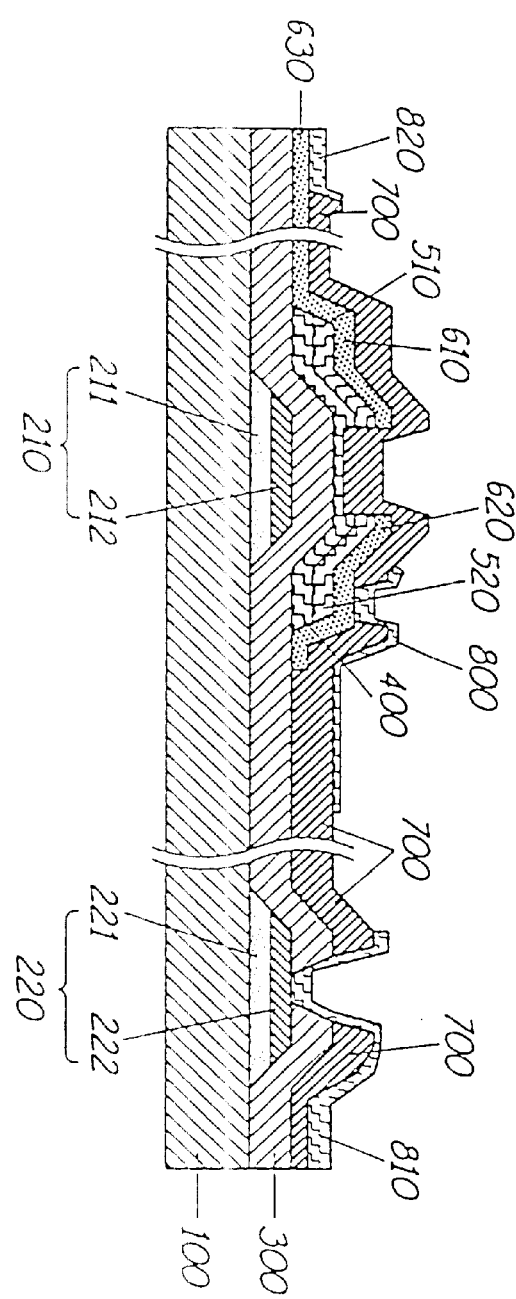
FIG. 10 is a sectional view taken along the line X–X' in FIG. 9A.

FIGS. 9A and 9B show layout views of a TFT substrate according to a first embodiment of the present invention, and FIG. 10 shows a cross-sectional view taken along the line X–X' in FIG. 9A.

A gate pattern consisting of a gate line 200, a gate electrode 210 which is a branch of the gate line 200, and a gate pad 220 which is connected to the one end of the gate line 200 is formed on a substrate 100. The gate electrode 210 and the gate pad 220 are formed of a lower layer 211 and 221 of Al or Al alloy and an upper layer 212 and 222 of MoW alloy comprising 0.01~20.0 atm % tungsten and the rest of molybdenum, and the gate line 200 is also formed of a dual layers of an Al or Al alloy layer and a MoW alloy layer. The gate pad 220 is a path to transmit the scanning signals from the outside to the gate line 200.

A gate insulating layer 300 having a contact hole 720 exposing the upper layer 222 of the gate pad 220 covers the gate pattern 200, 210, and 220. A hydrogen amorphous silicon (a-si:H) layer 400 and a doped hydrogen amorphous silicon layer 510 and 520 with N type impurity are sequentially formed on the portion of the gate insulating layer 300 above the gate electrode 210, and the portions 510 and 520 of the doped amorphous silicon layer 510 are opposite with respect to the gate line.

A data line 600 crossing the gate line 200 is formed on the gate insulating layer 300, and a data pad 630 for transmitting the image signals from the outside to the data line 600 is connected to the one end of the data line 600. A source electrode 610 which is a branch of the data line 600 is formed on a first portion 510 of the doped amorphous silicon layer, and a drain electrode 620 opposite the source electrode 610 with respect to the gate electrode 200 is formed on a second portion 520 of the doped amorphous silicon layer 510 and 520. Here, a data pattern including the data line 600, the source and drain electrodes 610 and 620, and the data pad 630 is formed of a Mo or MoW alloy layer. On the hand, in FIG. 9B, a supplementary gate pad 640 is additionally formed on the gate insulating layer 300 nearby the gate pad 210.

A passivation layer 700 is formed on the data pattern 600, 610, 620 and 630 and portions of the amorphous silicon layer 500 which are not covered by the data pattern. The passivation layer 700 has contact holes 710, 720, and 730 exposing the drain electrode 620, the upper layer 222 of the gate pad 220 and the data pad 630, respectively. On the other hand, in FIG. 9B, the passivation layer 700 has a contact hole 740 exposing the supplementary gate pad 640.

Finally, a pixel electrode 800 made of ITO (indium tin oxide) and connected to the drain electrode 602 through the contact hole 710 is formed on the passivation layer 700. Furthermore, a data ITO layer 820 connected to the data pad 630 through the contact hole 730 and transmitting image signals from outside to the data line 600, and a gate ITO layer 810 connected to the gate pad 220 through the contact hole 720 and transmitting scanning signals from outside to the gate line 200 are formed on the passivation layer 700. On the other hand, in FIG. 9B, the gate ITO layer 810 extended to the supplementary gate pad 640 to be connected to the supplementary gate pad 640 through the contact hole 740.

As shown in FIGS. 9A and 9B, the portions to which the signals are directly applied are substantially the gate ITO layer 810 and the data ITO layer 820.

A manufacturing method of a TFT substrate will now be described specifically with reference to the attached drawings.

FIGS. 11A–11D are sectional views illustrating a manufacturing method of a TFT substrate shown in FIG. 9A and FIG. 10 using 5 masks according to an embodiment of the present invention.

Figure 11A:
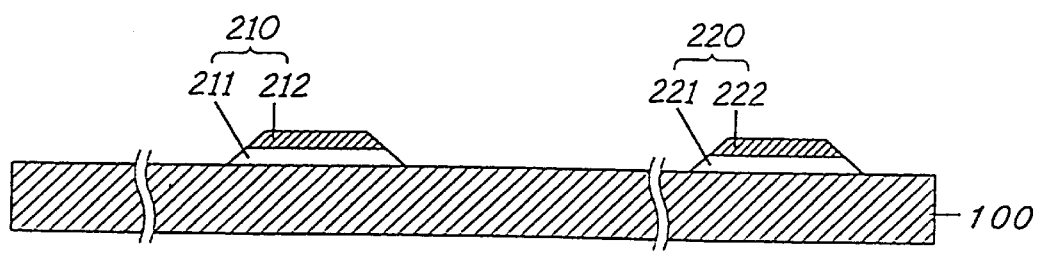
FIGS. 11A–11D are sectional views illustrating a manufacturing method of a TFT substrate shown in FIG. 10 according to an embodiment of the present invention.

As shown in FIG. 11A, a lower layer made of either Al or Al alloy with thickness of 1,000~5,000 Å and an upper layer made of MoW alloy with thickness 200~1,500 Å are sequentially deposited on a transparent insulating substrate 100 and patterned to form a gate line 200, a gate electrode 210 and a gate pad 220 using a first mask. As shown in FIG. 11A, the gate electrode 210 and the gate pad 220 are formed of a lower layer 211 and 221 of Al or Al alloy and an upper layer 212 and 222 of MoW alloy, respectively. Although it is not shown in FIG. 11A, the gate line 200 is also formed of the dual layer.

In case of using an Al alloy, the Al alloy comprises Al and both/either a transition metal and/or a rare earth metal of less than 5%. The MoW alloy comprises 0.01~20.0 atm % tungsten and the rest of molybdenum. Preferably, the tungsten content is in the range of 9–11 atm %. An etchant for wet etching the layers is an Al etchant such as $CH_3COOH/HNO_3/H_3PO_4/H_2O$, where the density of $HNO_3$ is 8–14%.

It is possible to form the gate pattern 200 to have a single-layered structure made from a member of the group of Al, Al alloy, and MoW alloy.

Figure 11B:
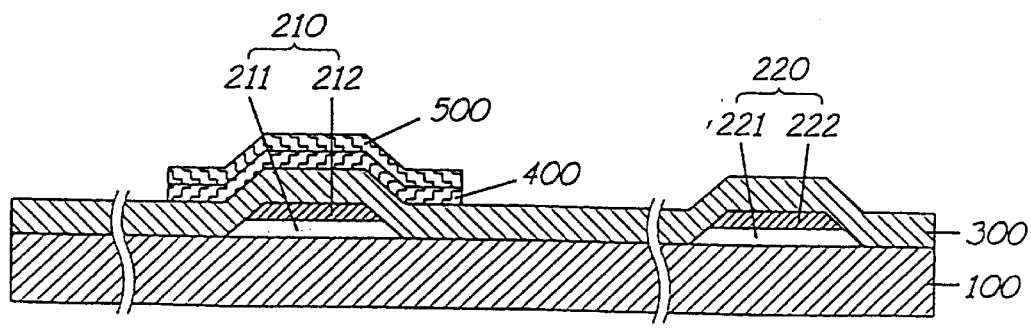

As shown in FIG. 11B, a gate insulating layer 300 with a thickness of 2,000~10,000 Å made of silicon nitride, a hydrogen amorphous silicon layer 400 with thickness of 1,000~3,000 Å and an extrinsic or doped hydrogen amorphous silicon layer 500 heavily doped with N type impurity with a thickness of 150~1,500 Å are sequentially deposited, and the amorphous silicon layer 400 and the extrinsic amorphous silicon 500 is patterned by photolithography using a second mask.

Figure 11C:
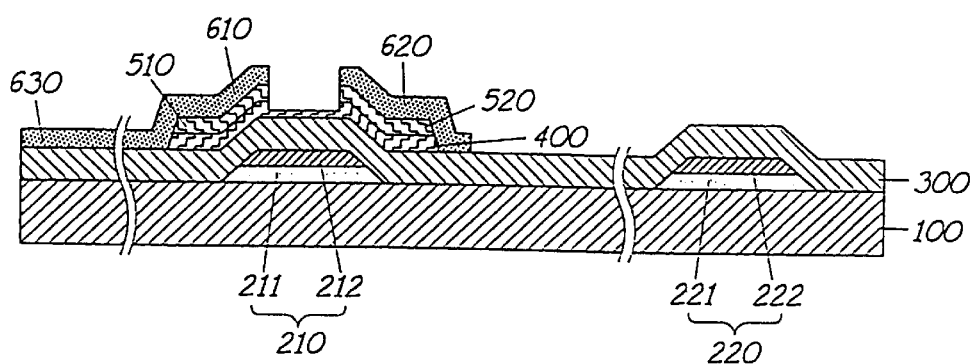

As shown in FIG. 11C, a molybdenum (Mo) or MoW alloy layer with a thickness of 3,000~20,000 Å is deposited and patterned to form a data pattern including a data line 600, a source electrode 610, a drain electrode 620, and a data pad 630 by photolithography with using a third mask.

In this step, the data pattern may have either a single-layered structure made of chromium, Mo, or MoW or a dual-layered structure including two layers made of Cr, Mo, or MoW. In addition the data pattern may further include an Al layer or an Al alloy layer.

Since the size of the substrate 100 becomes large and the pixel density of the display becomes high, it is desirable to reduce the width of wirings. On the other hand, since the wiring has low resistance, the thickness of wirings should increase. Accordingly, the stress of the metal layer should not bend the substrate, though the thickness of the metal layer increases. The Mo or MoW alloy layer gives low stress on the substrate, which will be describe in the first experiment in detail.

When the data pattern has a dual-layered structure including a chromium layer as a lower layer and a MoW layer as an upper layer, the upper and the lower layers are formed in a taper shape by sequentially patterning under the same etching condition. In detail, this will be describe in second, third and fourth experiments.

If the upper and the lower layers are wet etched, an etchant used for this wet etch may be an etchant for chromium, such as $HNO_3/(NH_4)_2Ce(NO_3)_6/H_2O$. It is preferable that the concentration of $HNO_3$ is 4 to 10% and the concentration of $(NH_4)_2Ce(NO_3)_6$ is 10 to 15%.

Then, the extrinsic amorphous silicon layer 500 is etched by using the data pattern 600, 610, 620, and 630 as an etch mask and by using a plasma dry etch technique to divide the extrinsic amorphous silicon layer 500 into portions 510 and 520 with respect to the gate electrode 210, and to expose the central portion of the amorphous silicon layer 400.

Here, because the data pattern made of Mo or MoW is easily etched by the gases for etching the extrinsic amorphous silicon layer, it is preferable to select a combination of etching gases having an etch rate less than 100 sec for Mo or MoW. Hydrogen halide gas mixed with at least one selected from group consisting of $CF_4$, $CHF_3$, $CHClF_2$, $CH_3F$ and $C_2F_6$, and hydrogen ($H_2$) plasma treatment may be added in order to stabilize the surface of the amorphous silicon layer 400.

In detail, this will be describe in a fifth, a sixth, and a seventh experiments.

Figure 11D:
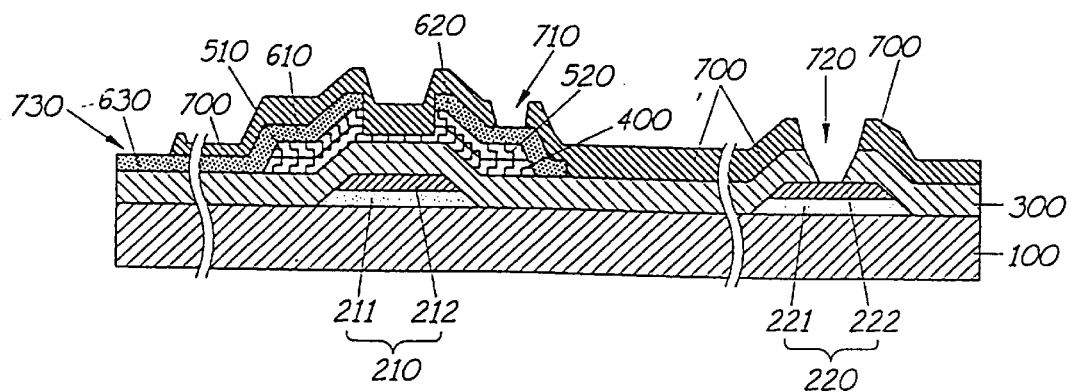

As shown in FIG. 11D, a passivation layer 700 with a thickness of 1,000~10,000 Å is deposited and patterned along with the gate insulating layer 300 by photolithography using a fourth mask to form a contact hole 710 on the drain electrode 620, a contact hole 720 on the upper layer 222 of the gate pad 220, and a contact hole 730 on the data pad 630.

As shown in FIG. 9B, a supplementary gate pad 640 may be formed in the step of forming the data pattern, and a contact hole 740 may be formed.

Now, the step of forming the contact holes is described in detail.

A photoresist having openings at the position corresponding to the contact holes 710, 720, 730, and 740 is formed on the passivation layer 700. The silicon nitride layers of the passivation layer 700 and the insulating layer 300 are etched by plasma dry etch using the photoresist as a mask.

In order to obtain smooth edge profile of the contact holes 710, 720, 730, and 740, the photoresist should be etched as well as the silicon nitride layers 700 and 300. For this purpose, the amount of oxygen gas used for etching the silicon nitride layer 700 and 300 may be increased or $SF_6$+HCl (selectively additional He gas) gas system or $SF_6$+$Cl_2$ (selectively additional He gas) gas system may be used under high frequency power in plasma dry etch. $SF_6$+HCl (+He) and $SF_6$+$Cl_2$ (+He) gas systems have etch rate of 2,500~3,000 Å/min both for photoresist and silicon nitride. However, since the gas systems also have etch rate of 2,000 Å/min for Mo or MoW alloy, the upper layer of the gate pad 220 and the data pattern 620, 630, and 640 made of Mo or MoW alloy are easily etched together with the silicon nitride layers 700 and 300.

In particular, the data pattern 620, 630, and 640 under the contact holes 710, 730, and 740 may be severely overetched. It is because both the passivation layer 700 and the insulating layer 300 are located on the gate pad 220, but only the passivation layer 700 is on the data pattern 620, 630, and 640. Accordingly, the data pattern 620, 630, and 640 is exposed to the gas system for a longer time than the upper layer of the gate pad 222.

To solve the above-described problem, a dry etch gas system using a gas such as $CF_4$+$O_2$ having etch rate of less than 400 Å/min for Mo or MOW alloy is desirable. The $CF_4$+$O_2$ gas system has an etch rate of less than 1,000 Å/min for photoresist, and an etch rate in the range of 6,000~10,000 Å/min for the silicon nitride. Accordingly, since the lateral portions of the silicon nitride layers 700 and 300 under the photoresist become overly etched compared with the photoresist as time goes by, under-cut is generated and the edge profiles of the contact holes are not good. However, the edge profile may be improved by reducing the etching time although using $CF_4$+$O_2$. In addition, it is preferable that the proportion of $O_2$ to $CF_4$ is less than 4/10.

Otherwise, it may be considered that the step of forming contact holes is performed through two or three sub-steps to improve the above-described problem.

FIGS. 12A, 12B, 13A, and 13B are sectional views illustrating a two-step etching method, and FIGS. 14A~14C, 15A~15C, 16A~16C, and 17A~17C are sectional views illustrating a three-step etching method. FIGS. 12A, 12B, 14A~14C and 16A~16C show the step of forming a contact hole 720 by etching the passivation layer 700 and the insulating layer 300 covering the gate pad 220, and FIGS. 13A, 13B, 15A~15C and 17A~17C shows the step of forming contact holes 710, 730 and 740 by etching the passivation layer 700 covering the data pattern 620, 630 and 640.

First, the two-step etching method is described with reference to FIGS. 12A, 12B, 13A, and 13D. In this method, the first step is to obtain a good edge profile of the contact holes, and the second step is to prevent consumption of Mo or MoW alloy.

Figure 12A:
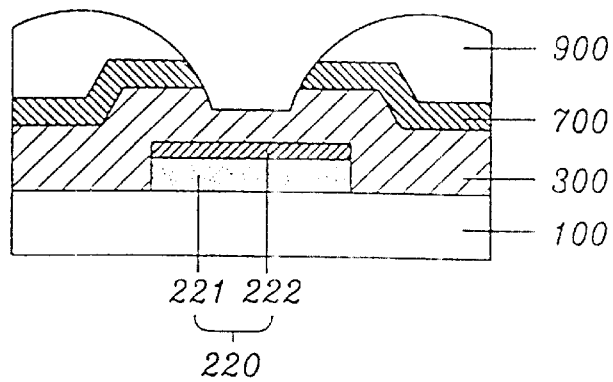
FIGS. 12A–17C are sectional views illustrating a process forming contact holes on the TFT substrate according to an embodiment of the present invention.
Figure 13A:
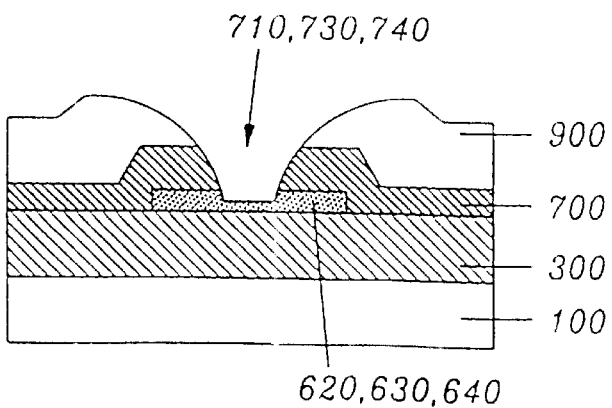
Figure 13B:
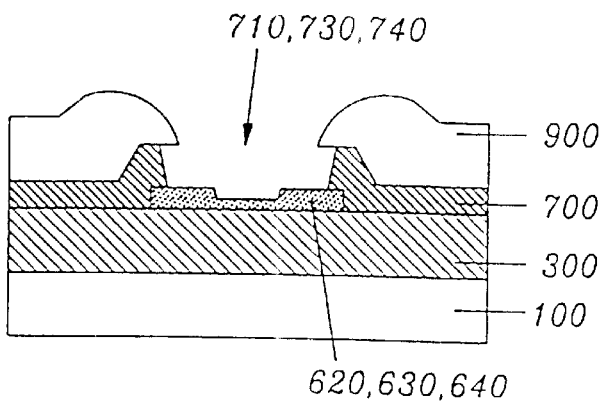

As shown in FIGS. 12A and 13B, a photoresist pattern 900 having an opening is formed on the passivation layer 700, and the photoresist pattern 900 the silicon nitride layers of the passivation layer 700 and the gate insulating layer 300 are dry etched using a gas system having etch rate for silicon nitride in the range between 1 to 1.5 times that for photoresist until the data pattern 620, 630 and 640 made of Mo or MoW alloy is exposed. The $SF_6$+HCl (+He) or $SF_6$+$Cl_2$ (+He) gas system may be used in this step. In this step, the data pattern 620, 630 and 640 may be slightly etched. The edge profiles of the contact holes 710, 720, 730 and 740 formed in this step are in the range of 30~80.

Figure 12B:
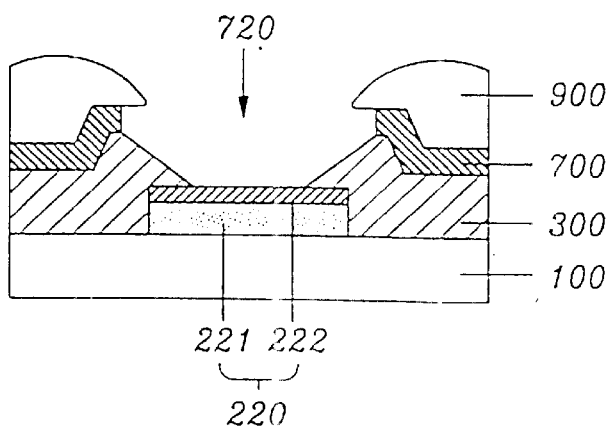

As shown in FIGS. 12B and 13B, the remaining thickness of the insulating layer 300 on the gate pad 220 is dry etched using a gas system having etch rate for silicon nitride equal to or larger than 15 times that for the MoW alloy. In this step, the lateral portions of the silicon nitride layers 700 and 300 are also etched. The $CF_4$+$O_2$ gas system is suitable for this step although it may not etch the photoresist pattern 900 so well.

Next, two methods for forming contact holes in three steps are described, where a polymer layer is formed.

First, the first three-step etching method is described with reference to FIGS. 14A–14C, 15A–15D.

Figure 14A:
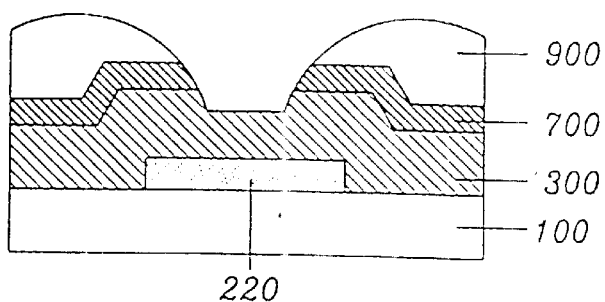
Figure 15A:
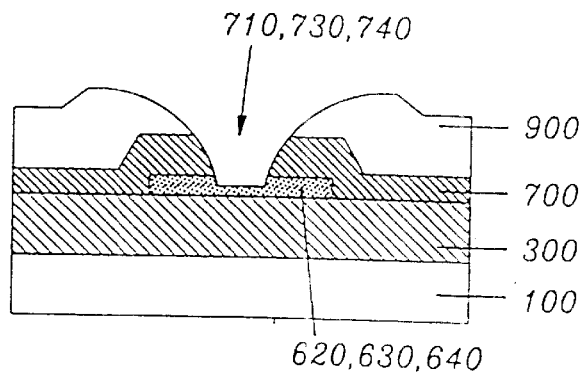

In the first step shown in FIGS. 14A and 15A, the photoresist pattern 900 and the silicon nitride layers 300 and 700 are dry etched by using an $SF_6$+HCl (+He) or $SF_6$+$Cl_2$ (+He) gas system until the data pattern 620, 630 and 640 of the Mo or MoW alloy under the contact holes 710, 720 and 730 is completely exposed. In this step, the data pattern 620, 630 and 640 may be etched to a certain thickness, to minimize the thickness of the portion of the insulating layer 300 remained on the gate pad 220, in order to minimize the etching time for etching the remained gate insulating layer 300.

Figure 14B:
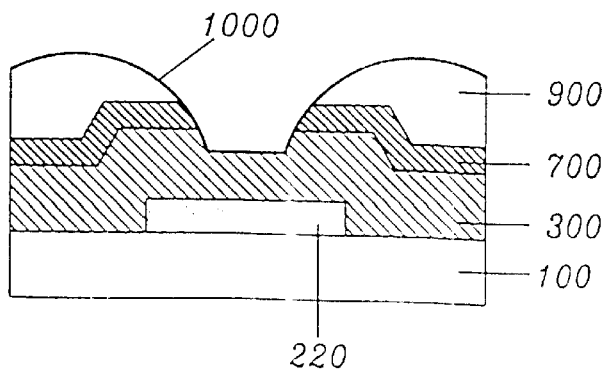
Figure 15B:
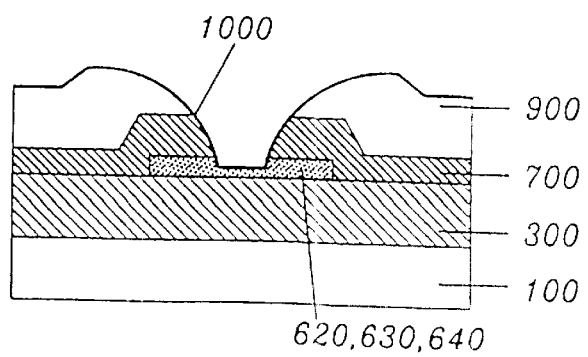

In the second step shown in FIGS. 14B and 15B, a polymer layer 1000, generated by the reaction of $CF_4$ and $H_2$ or HCl in plasma state, is formed on the exposed surface of the photoresist 900 and the silicon nitride layers 700 and 300. This polymer layer 1000 prevents the silicon nitride layers 700 and 300 from being etched in the lateral direction.

Figure 14C:
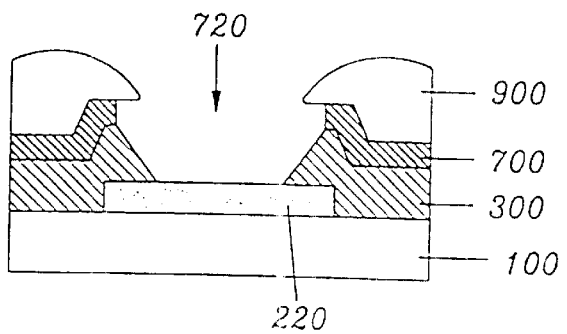
Figure 15C:
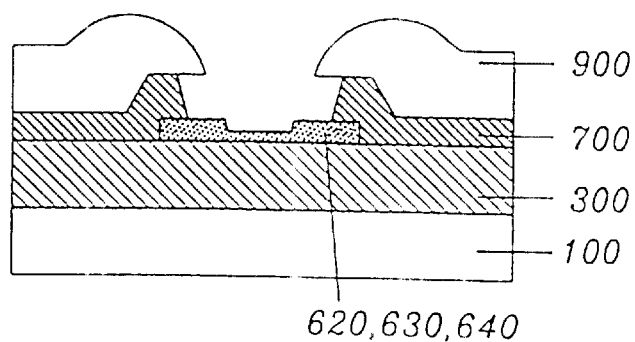

Finally, in the third step shown in FIGS. 14C and 15C, the remaining thickness of the insulating layer 300 on the gate pad 220 is dry etched using a gas system having etch rate for silicon nitride equal to or larger than 15 times that for the MoW alloy, and the contact holes are completed. The $CF_4$+$O_2$ gas system is suitable for this step although it may not etch the photoresist pattern 900 so well. In this step, the lateral portions of the silicon nitride layers 700 and 300 are also etched. However, since the etch rate of MoW alloy for $CF_4+O_2$ is about 300 Å/min, the data pattern 620, 630, and 640 is hardly etched until the gate pad 220 is exposed. Furthermore, the lateral portions of the contact holes 710, 720, 730, and 740 have a smooth profile, because the polymer layer 1000 causes the lateral etch of the silicon nitride layers 300 and 700 to be reduced compared with the vertical etch of the gate insulating layer 300.

Here, the etch rates of the passivation layer 700 and the gate insulating layer 300 may be different from each other, because the silicon nitride layers 300 and 700 may be formed to have different characteristics in manufacturing process.

Now, the second three-step etching method is described.

In the second method, plasma dry etch is performed twice using a gas system having an etch rate for silicon nitride equal to or more than 15 times that for Mo or MoW alloy, and a step of forming a polymer layer is added between the two plasma dry etch steps.

Figure 16A:
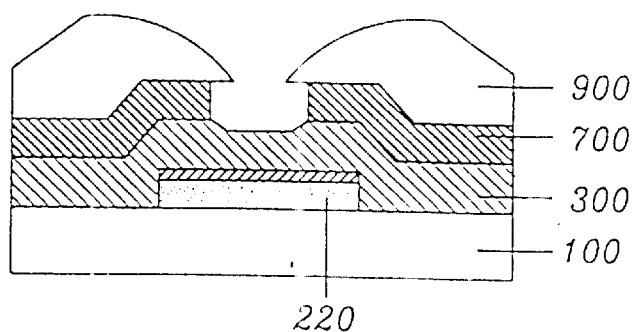
Figure 17A:
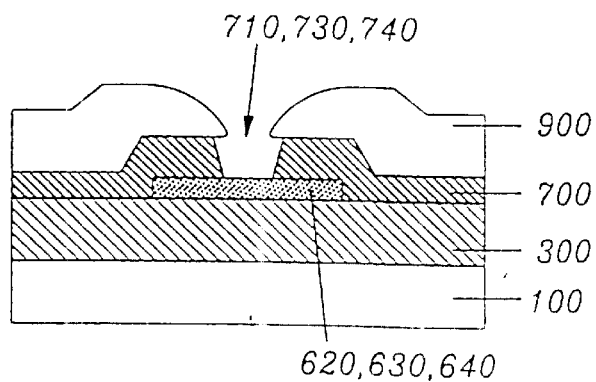

In the first step shown in FIGS. 16A and 17A, portions of the nitride layers 700 and 300 are etched by using $CF_4+O_2$ to form contact holes 710, 730, and 740 until the data pattern 620, 630, and 640 of the MoW alloy is exposed.

Figure 16B:
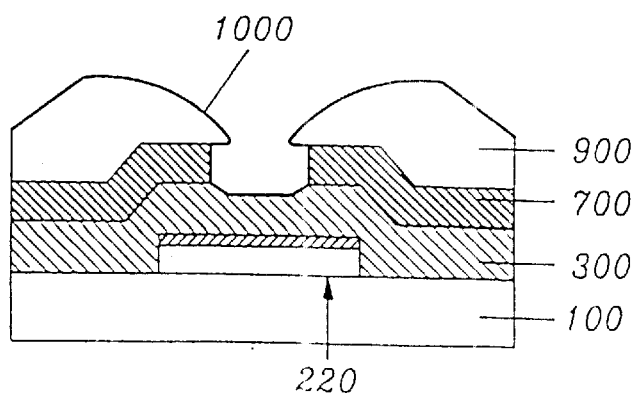
Figure 17B:
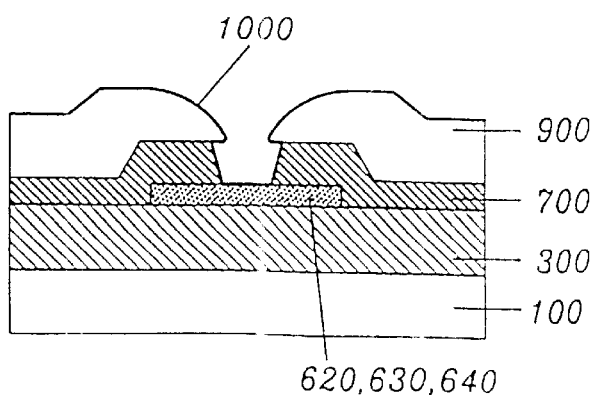

In the second step shown in FIGS. 16B and 17B, a polymer layer 1000, generated by reaction of $CF_4$ and $H_2$ or HCl in plasma state is formed on the exposed surface of the photoresist 900 and the silicon nitride layers 700 and 300. The polymer layer 1000 causes the silicon nitride layers 700 and 300 to be etched less in the lateral direction. Furthermore the photoresist pattern 900 prevents the ions from impacting on the lateral portions of the silicon nitride layers 700 and 300.

Figure 16C:
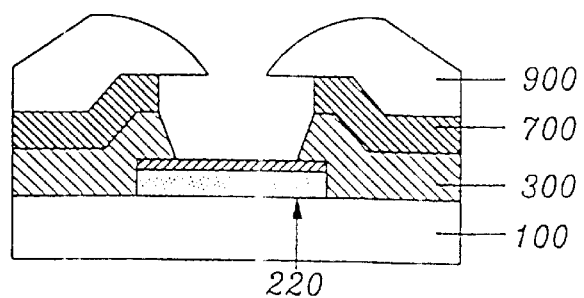
Figure 17C:
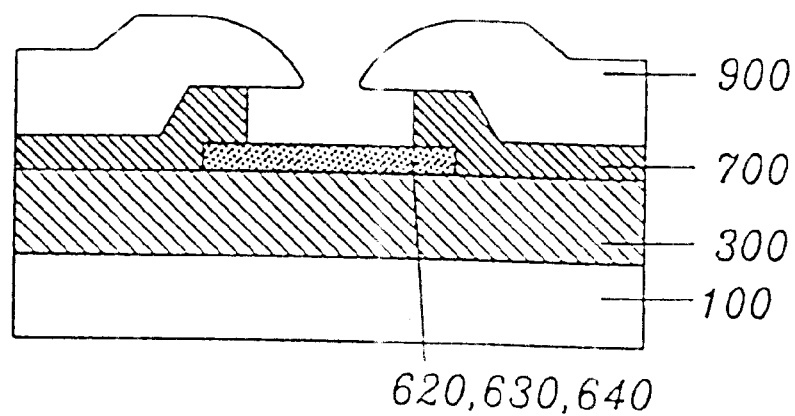

The final step is executed in the same way as the first step to complete the contact holes as shown in FIGS. 16C and 17C.

The second method using one gas system for dry etch is simple compared with the first method.

In the meantime, since the photoresist 900 and the silicon nitride layers 300 and 700 are etched to the similar degree in the first step of the first method, the polymer layer 1000 on the lateral portion of the passivation layer 700 is directly exposed to the impact of the etching gas. However, in the first step of the second method, an under-cut of the passivation layer 700 is generated under the photoresist 900 as shown in FIG. 17A, because $CF_4+O_2$ has a low etch rate less than 1,000 min for the photoresist 900. Accordingly, in the third step shown in FIG. 17C, the photoresist pattern 900 prevents the polymer layer 1000 formed on the lateral portion of the passivation layer 700 from being exposed to the dry etch gas, when the silicon nitride layer 700 and 300 is etched by using $CF_4+O_2$. Therefore, the photoresist pattern 900 reduces the lateral etch of the passivation layer 700 in the second method.

In the above-described plasma dry etch methods, it is preferable that the proportion of $O_2$ with respect to $CF_4$ is less than 4/10 to minimize etching of the Mo or MoW alloy.

When the proportion of $O_2$ with respect to $CF_4$ is less than 4/10, the contact holes 710, 720, 730, and 740 may be simultaneously formed through one etch step.

These methods are applied to all processes for forming contact holes having smooth edge profiles without consuming metal layers, where insulating layers on the metal layers have different thicknesses.

For example, in a structure where a first metal layer, an insulating layer, a second metal layer, and a second insulating layer are formed in sequence, these methods can be applied to a process for simultaneously forming a first contact hole exposing the second metal layer under the second insulating layer and a second contact hole exposing the first metal layer under the second and the first insulating layer.

In detail, smooth edge profiles of the contact holes are formed by using a dry etching gas system having an etch rate for the insulating layer in the range between 1 and 1.5 times that of photoresist, and the contact holes are completed under the condition that the etch rate for the insulating layer is equal to or larger than 15 times that of the metal layer. The step of forming a polymer layer for reducing the insulating layer to be etched in the lateral direction may be added.

When an aluminum layer or an aluminum alloy layer is used as an upper layer of the data pad, it should eliminated to prevent the layer from being in contact with ITO to be deposited subsequently.

Finally, an ITO layer with thickness of 300~2,000 Å is deposited and patterned by photolithography using a fifth mask to form a pixel electrode 800 connected to the drain electrode 620 through contact hole 710, a gate ITO layer 810 connected to the gate pad 220 through contact hole 720, and a data ITO layer 820 connected to the data pad 630 through contact hole 730, as shown in FIG. 10.

Here, in the case of forming the supplementary gate pad 640 and the contact hole 740, the gate ITO layer 810 is extended to the supplementary gate pad 640, as shown in FIG. 9B.

It is possible to prevent an oxidation caused by direct contact of Al or an Al alloy to the ITO by making the upper layer of the gate pad 220 out of Mo or a MoW alloy.

Figure 18:
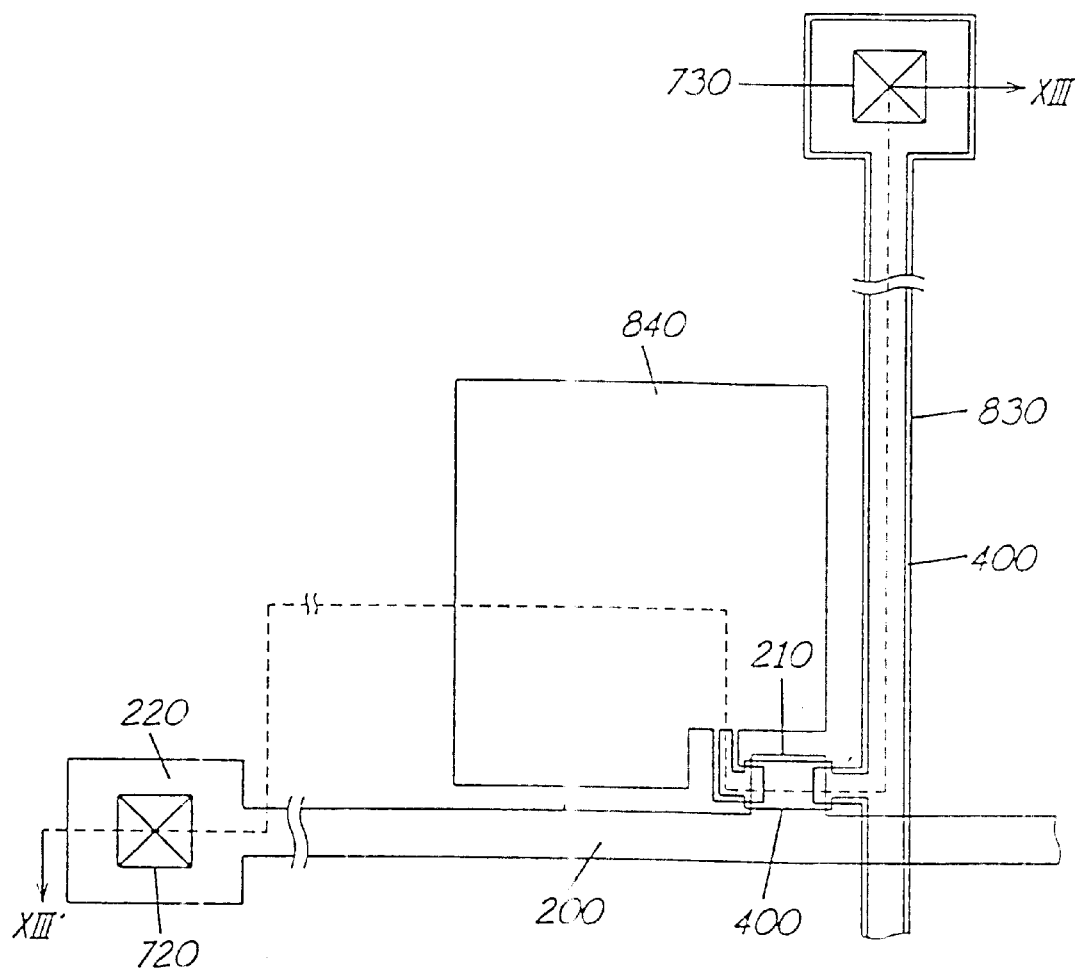
FIG. 18 is a layout view of a TFT substrate according to a second embodiment of the present invention.
Figure 19:
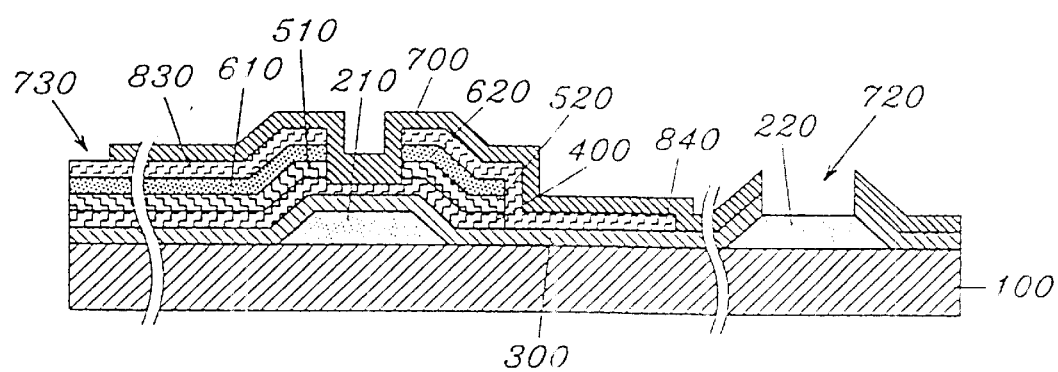
FIG. 19 is a sectional view taken along the line XVII-I–XVIII' in FIG. 18.

FIG. 18 shows a layout view of a TFT substrate according to a second embodiment of the present invention, FIG. 19 shows a sectional view taken along the line XIX–XIX' in FIG. 18, and the same reference numerals in FIGS. 9A 9B and 10 indicate the parts having the same or similar function.

A gate pattern including a gate line 200, a gate electrode 210, which is a branch of the gate line 200, and a gate pad 220 connected to the one end of the gate line 200 is formed on a substrate 100. The gate pattern is made of a single layer of MoW alloy, and the gate pad 220 is a path to transmit the scanning signals from the outside to the gate line 200.

A gate insulating layer 300 having a contact hole 720 exposing the gate pad 220 covers the gate pattern 200, 210, and 220. A hydrogen amorphous silicon layer 400 is formed on the gate insulating layer 300. The amorphous silicon layer 400 is located at the position corresponding to the gate electrode 210, functions as an active layer of TFT (thin film transistor), and extends in the longitudinal direction.

A doped hydrogen amorphous silicon layer 510 and 520 with N type impurity is formed on the amorphous silicon layer 400. A data pattern 610 and 620 made of MoW alloy is formed on the doped amorphous silicon layer 510 and 520. The doped amorphous silicon layer 510 and 520 and the data pattern 610 and 620, which are divided into two portions with respect to the gate electrode 210 and are formed along the amorphous silicon layer 400, have the same shapes.

A transparent conductive pattern 830 and 840 made of ITO is formed on the data pattern 610 and 620. One portion 830 of the ITO pattern is formed along the data pattern 610 and the doped amorphous silicon layer 510, and the other portion 840 of the ITO pattern covers the data pattern 620, and extends to the center of a pixel to form a pixel electrode.

Finally, a passivation layer 700, having contact holes 720 and 730 respectively exposing the gate pad 720 and the end portion of the ITO pattern 830, is formed on the ITO pattern 830 and 840 and on portions of the gate insulating layer 300 which is not covered by the ITO pattern.

A manufacturing method of another TFT substrate shown in FIGS. 18 and 19 will now be described specifically with reference to the attached drawings.

Figure 20A:
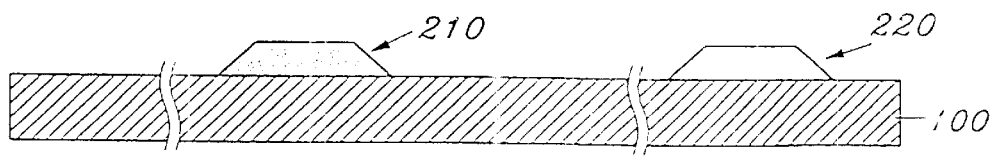
FIGS. 20A–20C are sectional views illustrating a manufacturing method of a TFT substrate shown in FIG. 19 according to the second embodiment of the present invention.
Figure 20B:
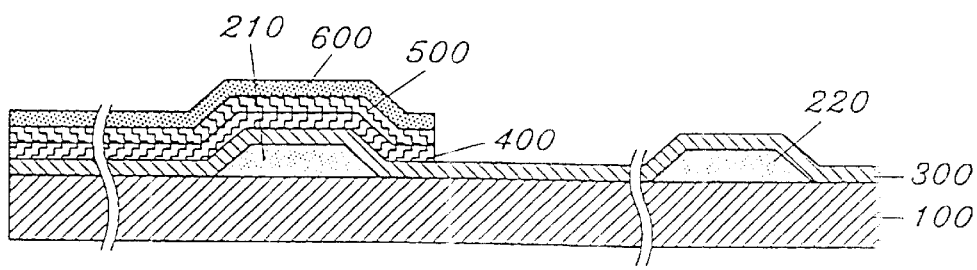
Figure 20C:
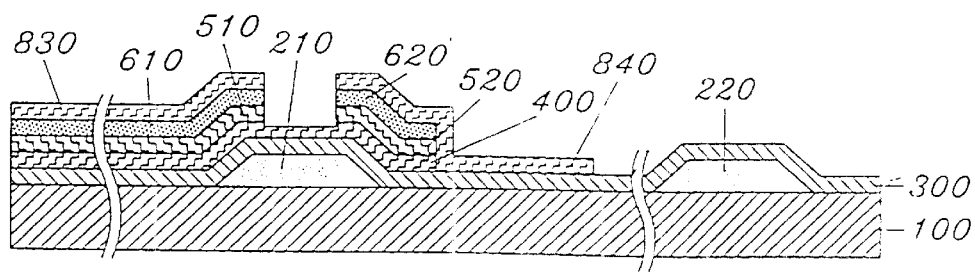

FIGS. 20A–20C are sectional views illustrating a manufacturing method of a TFT substrate shown in FIGS. 18 and 19 using 4 masks according to an embodiment of the present invention.

As shown in FIG. 20A, a layer made of MoW alloy with a thickness 1000~20,000 Å is deposited on a transparent insulating substrate 100 and is patterned by performing photolithography using a first mask to form a gate pattern including a gate line 200, a gate electrode 210, and a gate pad 220.

Here, the MoW alloy comprises 0.01~20.0 atm % tungsten and the rest of molybdenum. Preferably, the tungsten content is in the range of 9–11 atm %. When the MoW alloy layer is wet etched, an Al etchant such as $CH_3COOH/HNO_3/H_3PO_4/H_2O$ may be used, and it is preferable that $HNO_3$ is 8~14%.

A dual-layered structure having a Mo or MoW layer and an Al or an Al alloy layer may be used for the gate pattern instead of the Mo or the MoW layer, and otherwise the gate pattern may have a single-layered structure made from Al or an Al alloy.

In case of using Al alloy, the Al alloy comprises Al and both/either a transition metal and/or a rare earth metal of less than 5%.

As shown in FIG. 11B, a gate insulating layer 300 with a thickness of 2,000~10,000 Å made from silicon nitride, a hydrogen amorphous silicon layer 400 with a thickness of 1,000~3,000 Å an extrinsic hydrogen amorphous silicon layer 500 heavily doped with N type impurity with a thickness of 150~1,500 Å and a layer made of MoW alloy with a thickness 3000~20,000 Å are sequentially deposited and patterned to form a MoW alloy layer 600, a doped amorphous silicon layer 500, and a amorphous silicon 400 by photolithography, using a second mask.

In this step, chromium (Cr) may be used instead of Mo or a MoW alloy. In addition, a double-layered structure having a Mo or MoW layer and either a Cr layer or an Al or an Al alloy layer may be used instead of the Mo or the MoW layer. An Al or Al alloy layer may be added to reduce the resistance.

Also, in a dual-layered structure including a chromium layer as a lower layer and a MoW layer as an upper layer, the upper and the lower layers have their edges tapered by sequentially patterning under the same etch condition.

If the above-described etch condition is a wet etch, the etchant of wet etch may be an etchant for chromium such as $HNO_3/(NH_4)_2Ce(NO_3)_6/H_2O$. It is preferable that the concentration of $HNO_3$ is 4 to 10% and the concentration of $(NH_4)_2Ce(NO_3)_6$ is 10 to 15%.

An ITO layer with thickness of 300~2,000 is deposited and patterned by photolithography, using a third mask to form an ITO pattern 830 and 840. The MoW alloy layer 600 and the extrinsic amorphous silicon layer 500 is wet and dry etched by using the ITO pattern 830 and 840 as an etch mask to form a data pattern 610 and 620 and a doped amorphous silicon layer 510 and 520, as shown in FIG. 20C.

Here, because the data pattern 610 and 620 made of Mo or MoW layer are covered with the ITO pattern, it is not necessary to select an etch gas system including hydrogen halide and one selected from $CF_4$, $CHF_3$, $CHClF_2$, $CH_3F$ and $C_2F_6$.

As shown in FIG. 19, a passivation layer 700 with a thickness of 1,000~10,000 Å is deposited and patterned along with the gate insulating layer 300 by photolithography, using a fourth mask to form contact holes 720 and 730 respectively exposing the gate pad 720 and the portion of the ITO pattern 830 corresponding to the end portion of the data pattern 610.

Now, the first experiment to the seventh experiment are described in detail.

The First Experiment

The first experiment relates to the deposition quality of the Mo or MoW alloy. In this experiment, a MoW alloy layer was deposited on a substrate through a sputtering technique using a MoW alloy target including 10 atm % tungsten under the temperature of about 150° C.

Figure 21:
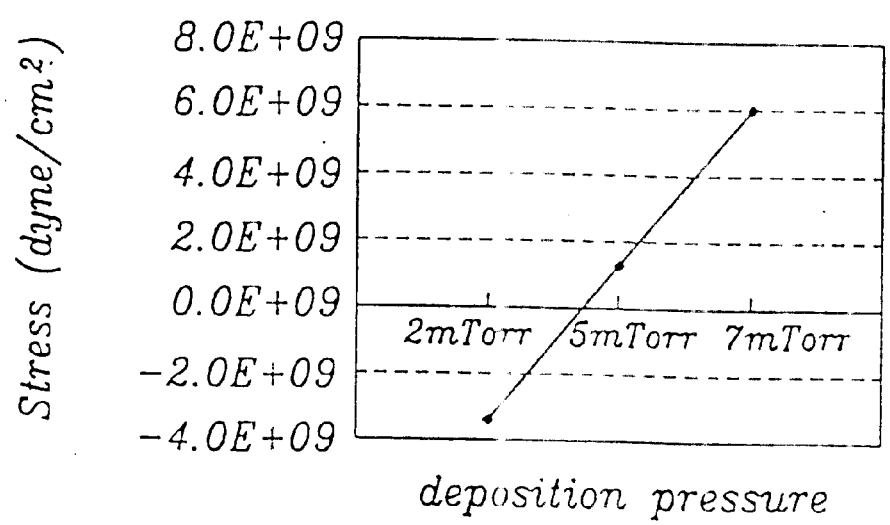
FIG. 21 is a graph illustrating relation of deposition pressure and stress of MoW according to a first experiment of the present invention.

FIG. 21 is a graph showing stress of a MoW alloy layer as a function of deposition pressure.

As shown in FIG. 21, the stress of MoW alloy varies from compressive stress to tensile stress in the range of $-3.0*10^9$ to $6.0*10^9$ as the variation of deposition pressure in the range of 2~7 mTorr. Accordingly, it is possible to control the stress of MoW alloy layer by varying deposition pressure, and thus not to bend the substrate when depositing a thick MoW alloy layer. Therefore, a wiring made of Mo or a MoW alloy may be used for the signal lines of large scale and high resolution liquid crystal displays, in particular, more than $370*470$ mm$^2$. The thickness and the width of the wiring is preferably in the range of 0.3~2.0 µm and 3.0~10 µm, respectively.

The second to fourth experiments relate to etch rate and edge profiles of a structure including a chromium layer and a Mo or MoW alloy layer.

The Second Experiment

The etch rate of a pure Mo layer and MoW alloy layers was measured in the second experiment.

Figure 22:
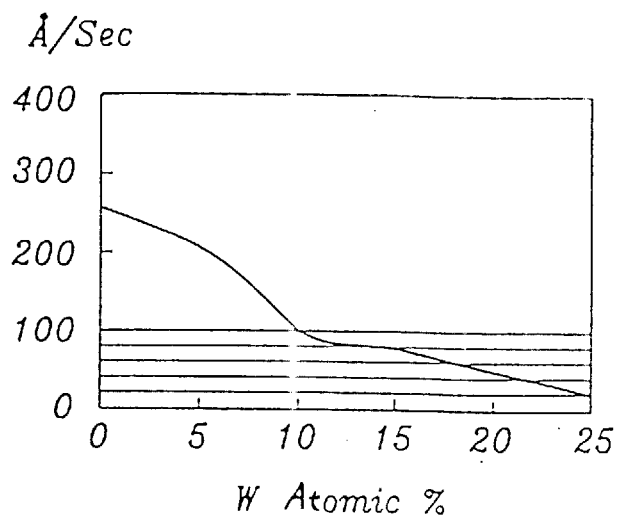
FIG. 22 is a graph showing etch rate of a MoW layer according to a second experiment of the present invention.

FIG. 22 is a graph showing etch rate in Å/sec of a MoW layer for a chromium etchant, $HNO_3/(H_4)_2CeNO_3)_6/H_2O$, as a function of a tungsten content in atm %.

As shown in FIG. 22, the etch rate of a pure Mo layer is as high as 250 Å/sec, but that of a MoW alloy layer including 10 atm % tungsten is 100 Å/sec. That of a MoW alloy layer including 15 to 25 atm % of tungsten is low as about 80~40 Å/sec.

On the other hand, the etch rate of the chromium layer for chromium etchant consisting of 4~10% $HNO_3$, 10~15% $(NH_4)_2Ce(NO_3)_6$ and $H_2O$ is about 40~60 Å/sec. Accordingly, when a MoW alloy layer having etch rate larger than 40~60 Å/sec is formed on a chromium layer, the wiring including the two layers may have a smooth edge profile.

The Third Experiment

Figure 23:
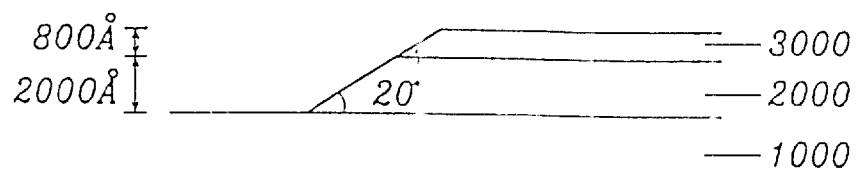
FIG. 23 is a sectional view of a dual layer made of a MoW layer and a chromium layer according to a third experiment of the present invention.

As shown in FIG. 23, which is a sectional view of a wiring having a dual-layered structure including an upper MoW layer and a lower chromium layer, a chromium layer 2000 with thickness of 2,000 was deposited on a substrate 1000, and a MoW alloy layer 3000 comprising 20 atm % tungsten was deposited to thickness of 800 Å on the chromium layer 2000. The chromium layer 2000 and the MoW alloy layer 3000 were sequentially etched by a chromium etchant, $HNO_3/H_4)_2CeNO_3)_6/H_2O$.

The Fourth Experiment

A chromium layer 2000 with thickness of 1,500 Å was deposited on a substrate and a MoW layer 3000 was deposited to thickness of 500 Å on the chromium layer 2000. The other condition was the same as that of the third experiment.

Figure 24:
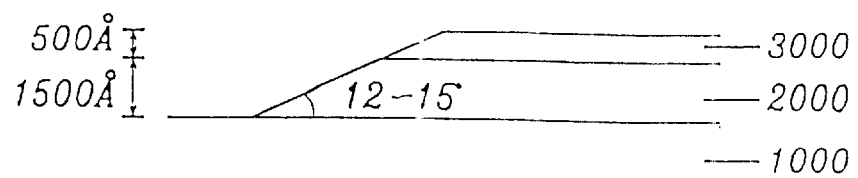
FIG. 24 is a sectional view of a dual layer made of a MoW layer and chromium layer according to a fourth experiment of the present invention.

As shown in FIG. 24, As a result, an edge having a taper angle about 12–15° was formed.

Accordingly, when a gate pattern or a data pattern of a display includes a chromium layer and a MoW alloy layer, they have edges having a smooth taper angle formed under the same etching condition and thus can be used in a large scale display.

Next, the step for etching a doped amorphous silicon layer using the data pattern 610 and 620 as an etch mask is described through the fifth experiment to the seventh experiment.

In these experiments, the thickness of the lower Al alloy layer 211 of the gate electrode 210 was 2,500 Å and that of the upper MoW layer 212 of the gate electrode 210 was 500 Å which are shown in FIG. 11d. The thickness of the gate insulating layer 300 was 4,500 Å that of the amorphous silicon layer 400 was 2,000 Å that of the doped amorphous silicon layer 500 was 500 that of the data pattern 610 and 620 was 4,000 Å and that of the passivation layer 700 was 3,000 Å which are all shown in FIG. 11d. Here, the data pattern 610 and 620 is made of Mo or MoW alloy.

The Fifth Experiment

The doped amorphous silicon layer 500 was etched by a plasma dry etching technique using a gas system such as $HCl+SF_6$ or $Cl_2+SF_6$.

Figures 25, 26:
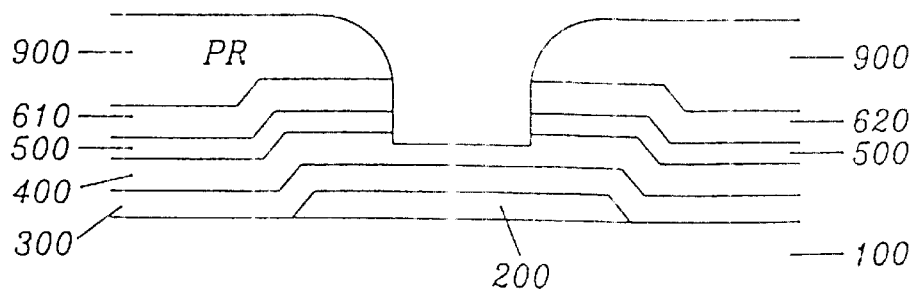
FIG. 25 is a graph of etch rate of a MoW layer for a dry-etch gas according to a fifth experiment of the present invention.
FIG. 26 is a sectional view illustrating a manufacturing method of TFT according to a sixth experiment of the present invention.

As shown in FIG. 25, the etch rates of the MoW alloy for $HCl+SF_6$ and $Cl_2+SF_6$ are as large as about 200~610 Å/min and 150~320 Å/min.

The Sixth Experiment

FIG. 26 is a sectional view illustrating a manufacturing method of TFT according to a sixth experiment.

As shown in FIG. 26, the metal layer made of MoW alloy was patterned to form the data pattern 610 and 620 through wet etch using a photoresist 900 as a mask. The doped amorphous silicon layer 500 was dry-etched by using $HCl+SF_6$ gas system using the photoresist 900 as an etch mask in order to prevent the consumption of the data pattern 610 and 620.

Accordingly, the source and drain electrodes 610 and 620 was hardly etched. On the other hand, ashing was added to eliminate the photoresist 900 hardened during dry etching, and $H_2$ plasma treatment is selectively added to improve the surface property of the amorphous silicon layer 400.

Figure 27:
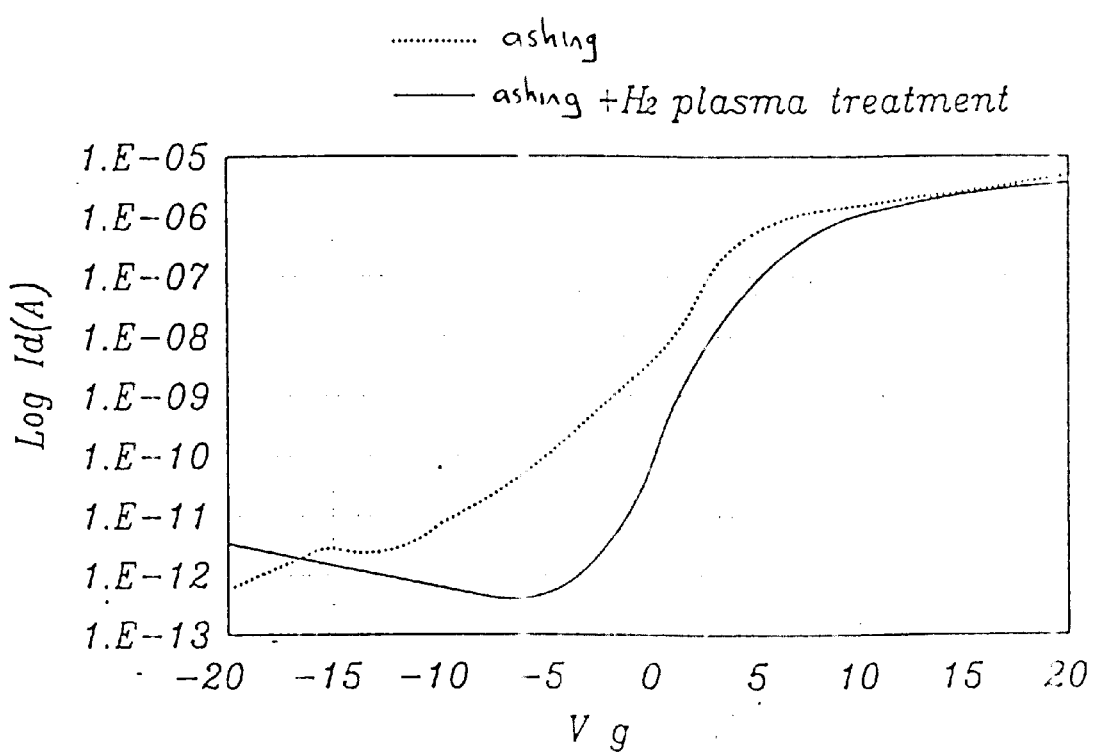
FIG. 27 is a graph illustrating a characteristic of TFT according to the sixth experiment of the present invention.

FIG. 27 is a graph illustrating a characteristic of a TFT manufactured by the sixth experiment. One curve indicates the characteristic of the TFT applying only ashing, and the other indicates the characteristic of TFT applying both ashing and $H_2$ plasma treatment. The horizontal axis shows a gate voltage $V_g$, and the vertical axis shows a current A in log scale between source and drain electrode.

The TFT characteristic was deteriorated when applying only ashing compared with the case of applying both ashing and hydrogen plasma treatment. This is because the oxygen gas $O_2$ used in ashing causes oxidation of the surface of the amorphous silicon layer 400, and $H_2$ plasma treatment eliminates the oxide on the surface and reduces OFF current of the TFT.

The Seventh Experiment

The doped amorphous silicon layer 500 was etched using a dry etching gas system of $HCl+CF_4$ after removing the photoresist 900 on the data pattern 610 and 620. Furthermore, ashing and $H_2$ plasma treatment are not added.

FIG. 28 is a table illustrating the etch rate of MoW for the $HCl+CF_4$ gas system. As shown in FIG. 28, the etch rate of the MoW alloy of the data pattern 610 and 620 for $HCl+CF_4$ was about 15~80 Å/min.

Compared with the fifth experiment, the etch rate of the MoW alloy for $HCl+CF_4$ gas system is remarkably reduced.

Figure 29:
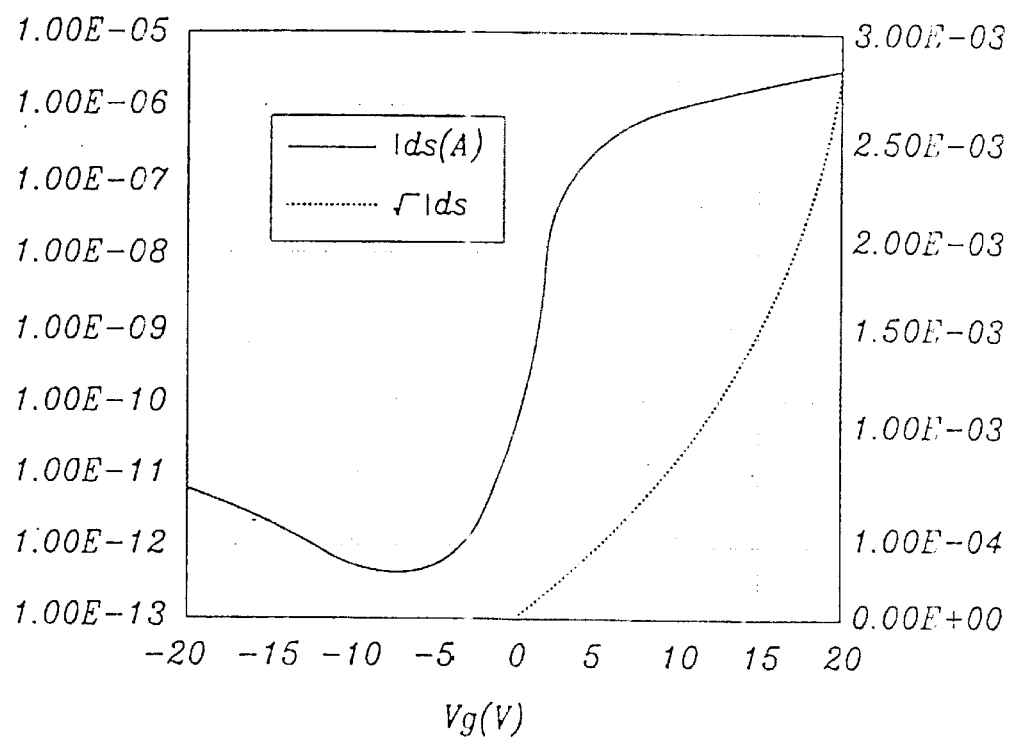
FIG. 29 is a graph illustrating a characteristic of TFT according to the seventh experiment of the present invention.

FIG. 29 is a graph illustrating characteristics of a TFT according to the seventh experiment, where the horizontal axis indicates a gate voltage $V_g$, the left vertical axis indicates a current (A) in log scale between the source and drain electrodes, and the right vertical axis indicates a characteristic gradient of the TFT.

As shown in FIG. 29, the measured ON/OFF current characteristics between the source and drain electrodes are good.

When an doped amorphous silicon layer formed under the Mo or MoW layer is etched by using the Mo or MoW layer as a mask in the manufacturing method of a semiconductor devices, it is preferable to use an etch gas system such as hydrogen halide and at least one selected from $CF_4$, $CHF_3$, $CHClF_2$, $CH_3F$, and $C_2F_6$.

According to the above-mentioned method for manufacturing the liquid crystal display according to the present invention, since the Mo or MoW composition layer has the low resistivity less than 15 $\mu\Omega$cm and is etched to have a smooth taper angle using an Al alloy etchant or a Cr etchant, the Mo or MoW layer is used for a wiring of a display or a semiconductor device along with an Al layer and a Cr layer. Since the Mo or MoW layer can be deposited so as to give low stress to the substrate by adjusting the deposition pressure, a single MoW layer can used as a wiring by itself. When contact holes are formed in the passivation layer or the gate insulating layer, a lateral etch is reduced by using a polymer layer, an etch gas system $CF_4+O_2$ can prevent the etch of the Mo or MoW alloy layer, and an etch gas $SF_6+HCl$ (+He) or $SF_6+Cl_2$ (+He) can form the edge profile of contact holes to be smoothed. Also, when an amorphous silicon layer formed under the Mo or MoW layer is etched by using the Mo or MoW layer as a mask, to use an etch gas system such as hydrogen halide and at least one selected from $CF_4$, $CHF_3$, $CHClF_2$, $CH_3F$ and $C_2F_6$ yield the good characteristics of TFT, and $H_2$ plasma treatment can cause the characteristics of the TFT to be improved.

The present invention is not restricted to the above embodiments, and it is clearly understood that many variations can be possible within the scope and spirit of the present invention by anyone skilled in the art.

What is claimed is:

1. A manufacturing method of a TFT substrate for a display, comprising:
   depositing a metal layer made of Al or Al alloy on a substrate;
   depositing a MoW alloy layer including tungsten of 0.01 atm % to 20 atm %, the rest of molybdenum and inevitable impurity, on the metal layer and the substrate;
   forming a gate line, a gate electrode connected to the gate line, and a gate pad connected to the gate line by patterning the MoW alloy layer and etching the metal layer using an etchant;
   depositing a gate insulating layer;
   forming an un-doped amorphous silicon layer and a doped amorphous silicon layer;

forming a data pattern including a data line, a source and a drain electrode, and a data pad connected to the data line;

etching the doped amorphous silicon layer using the data pattern as an etch mask;

depositing a passivation layer;

patterning the passivation layer along with the gate insulating layer to expose portions of the gate pad, the data pad and the drain electrode;

depositing a transparent conductive layer; and etching the transparent conductive layer to form a gate conductive layer connected to the gate pad and a pixel electrode connected to the drain electrode, wherein the metal layer comprises an aluminum and a transition metal or a rare earth metal less than 5%, wherein the etchant is CH3COOH/HNO3/H3PO4/H2O having HNO3 of the concentration of 8–14%, and wherein the data pattern comprises a lower layer made of chromium and an upper layer made of a MoW alloy layer including tungsten of 0.01 atm % to 25 atm %, the rest of molybdenum and inevitable impurity, and the data pattern is etched by using $HNO_3/(NH_4)_2Ce(NO_3)_6/H_2O$.

2. The manufacturing method as claimed in claim 1, wherein the concentration of $HNO_3$ is 4–10% and the concentration of $(NH_4)_2Ce(NO_3)_6$ is 10–15%.

3. The manufacturing method as claimed in claim 1, wherein the doped amorphous silicon layer is dry etched by using a gas consisting of a hydrogen halide and at least one selected from the group consisting of CF4, CHF3, CHClF2, CH3F and C2F6.

4. A manufacturing method of a TFT substrate for a display, comprising:

depositing a metal layer made of Al or Al alloy on a substrate;

depositing a MoW alloy layer including tungsten of 0.01 atm % to 20 atm %, the rest of molybdenum and inevitable impurity, on the metal layer and the substrate;

forming a gate line, a gate electrode connected to the gate line, and a gate pad connected to the gate line by patterning the MoW alloy layer and etching the metal layer using an etchant;

depositing a gate insulating layer;

forming an un-doped amorphous silicon layer and a doped amorphous silicon layer;

forming a data pattern including a data line, a source and a drain electrode, and a data pad connected to the data line;

etching the doped amorphous silicon layer using the data pattern as an etch mask;

depositing a passivation layer;

patterning the passivation layer along with the gate insulating layer to expose portions of the gate pad, the data pad and the drain electrode;

depositing a transparent conductive layer; and etching the transparent conductive layer to form a gate conductive layer connected to the gate pad and a pixel electrode connected to the drain electrode, wherein the metal layer comprises an aluminum and a transition metal or a rare earth metal less than 5%, wherein the etchant is CH3COOH/HNO3/H3PO4/H2O having HNO3 of the concentration of 8–14%, wherein the data pattern comprises either a single layer of one selected from the group consisting of Cr, Mo or MoW alloy including tungsten, the rest of molybdenum and inevitable impurity, or a layer having a dual-layered structure of two selected from the group consisting of Cr, Mo or MoW alloy including tungsten, the rest of molybdenum and inevitable impurity, and wherein the patterning step comprises;

forming a photoresist pattern on the passivation layer, the photoresist pattern having openings at the positions corresponding to the gate pad, the data pad and the drain electrode, exposing the data pad and the drain electrode under the condition of etch selectivity rate of the photoresist pattern to the insulating layer and the passivation layer in range of 1:1 to 1:1.5; and exposing the gate pad under the condition of etch rate of the gate insulating layer and the passivation layer larger than 15 times than the etch rate of the data pattern.

5. The manufacturing method as claimed in claim 4, wherein either $SF_6+HCl$ or $SF_6+Cl_2$ is used in the step of exposing the data pad and the drain electrode and $CF_4+O_2$ is used in the step of exposing the gate pad.

6. A manufacturing method of a TFT substrate for a display, comprising:

depositing a metal layer made of Al or Al alloy on a substrate;

depositing a MoW alloy layer including tungsten of 0.01 atm % to 20 atm %, the rest of molybdenum and inevitable impurity, on the metal layer and the substrate;

forming a gate line, a gate electrode connected to the gate line, and a gate pad connected to the gate line by patterning the MoW alloy layer and etching the metal layer using an etchant;

depositing a gate insulating layer;

forming an un-doped amorphous silicon layer and a doped amorphous silicon layer;

forming a data pattern including a data line, a source and a drain electrode, and a data pad connected to the data line;

etching the doped amorphous silicon layer using the data pattern as an etch mask;

depositing a passivation layer;

patterning the passivation layer along with the gate insulating layer to expose portions of the gate pad, the data pad and the drain electrode;

depositing a transparent conductive layer; and etching the transparent conductive layer to form a gate conductive layer connected to the gate pad and a pixel electrode connected to the drain electrode, wherein the metal layer comprises an aluminum and a transition metal or a rare earth metal less than 5%, wherein the etchant is CH3COOH/HNO3/H3PO4/H2O having HNO3 of the concentration of 8–14%, wherein the data pattern comprises either a single layer of one selected from the group consisting of Cr, Mo or MoW alloy including tungsten, the rest of molybdenum and inevitable impurity, or a layer having a dual-layered structure of two selected from the group consisting of Cr, Mo or MoW alloy including tungsten, the rest of molybdenum and inevitable impurity, and wherein the patterning step comprises;

forming a photoresist pattern on the passivation layer, the photoresist pattern having openings at the positions corresponding to the gate pad, the data pad and the drain electrode, exposing the data pad and the drain electrode;

forming a polymer layer on the substrate by reacting $CF_4$ and either $H_2$ or HCl in plasma; and exposing the gate pad under the condition of etch rate of the gate insulating layer and the passivation layer larger than 15 times than the etch rate of the data pattern.

7. The manufacturing method of TFT substrate for the display as claimed in claim 6, wherein $CF_4+O_2$ is used in the step of exposing the gate pad and one selected from the group consisting of $SF_6+HCl$, $SF_6+Cl_2$ and $CF_4+O_2$ is used in the step of exposing the data pad and the drain electrode.

8. A manufacturing method of a TFT substrate for a display, comprising:

depositing a metal layer made of Al or Al alloy on a substrate;

depositing a MoW alloy layer including tungsten of 0.01 atm % to 20 atm %, the rest of molybdenum and inevitable impurity, on the metal layer and the substrate;

forming a gate line, a gate electrode connected to the gate line, and a gate pad connected to the gate line by patterning the MoW alloy layer and etching the metal layer using an etchant;

depositing a gate insulating layer;

forming an un-doped amorphous silicon layer and a doped amorphous silicon layer;

forming a data pattern including a data line, a source and a drain electrode, and a data pad connected to the data line;

etching the doped amorphous silicon layer using the data pattern as an etch mask;

depositing a passivation layer;

patterning the passivation layer along with the gate insulating layer to expose portions of the gate pad, the data pad and the drain electrode;

depositing a transparent conductive layer; and etching the transparent conductive layer to form a gate conductive layer connected to the gate pad and a pixel electrode connected to the drain electrode, wherein the metal layer comprises an aluminum and a transition metal or a rare earth metal less than 5%, wherein the etchant is CH3COOH/HNO3/H3PO4/H2O having HNO3 of the concentration of 8–14%, wherein the data pattern comprises either a single layer of one selected from the group consisting of Cr, Mo or MoW alloy including tungsten, the rest of molybdenum and inevitable impurity, or a layer having a dual-layered structure of two selected from the group consisting of Cr, Mo or MoW alloy including tungsten, the rest of molybdenum and inevitable impurity, and wherein the patterning step comprises;

forming a photoresist pattern on the passivation layer, the photoresist pattern having openings at the positions corresponding to the gate pad, the data pad and the drain electrode, exposing the data pad, the drain electrode and the gate pad by using the photoresist pattern as an etch mask and by using $CF_4+O_2$.

9. The manufacturing method as claimed in claim 8, wherein the proportion of $O_2$ to $CF_4$ is less than 4 to 10.

10. A manufacturing method of a TFT substrate for display comprises steps:

depositing a MoW alloy layer including tungsten of 0.01 atm % to 20 atm %, the rest of molybdenum and inevitable impurity on a substrate;

forming a gate line, a gate electrode connected to the gate line, and a gate pad connected to the gate line by patterning the MoW alloy layer using an etchant and using a first mask;

depositing a gate insulating layer, an undoped amorphous silicon layer, a doped amorphous silicon layer, and a metal layer in sequence on the substrate;

etching sequentially the metal layer, the doped amorphous silicon layer and the undoped amorphous silicon layer using a second mask;

forming a pixel electrode having opening on the metal layer using a third mask;

forming a data line, a source and a drain electrode, and a contact layer by etching the metal layer and the doped amorphous silicon layer using the pixel electrode as a mask;

depositing a passivation layer; and etching the passivation along with the gate insulating layer on the gate pad using a fourth mask.

11. The manufacturing method as claimed in claim 10, further comprising steps of:

depositing a metal layer made of Al or Al alloy under the MoW alloy layer; and etching the metal layer along with the MoW alloy layer by using the etchant.

12. The manufacturing method as claimed in claim 11, wherein the metal layer comprises aluminum and a transition metal or a rare earth metal less than 5%.

13. The manufacturing method as claimed in claim 12, wherein the etchant is $CH_3COOH/HNO_3/H_3PO_4/H_2O$ having $HNO_3$ of the concentration of 8–14%.

14. The manufacturing method as claimed in claim 13, wherein the data pattern comprises either a single layer of one selected from the group consisting of Cr, Mo or MoW alloy including tungsten, the rest of molybdenum and inevitable impurity, or a layer having a dual-layered structure of two selected from the group consisting of Cr, Mo or MoW alloy including tungsten, the rest of molybdenum and inevitable impurity.

15. The manufacturing method as claimed in claim 14, wherein the data pattern comprises a lower layer made of chromium and an upper layer made of a MoW alloy layer including tungsten of 0.01 atm % to 25 atm %, the rest of molybdenum and inevitable impurity, and the data pattern is etched by using $HNO_3/(NH_4)_2Ce(NO_3)_6/H_2O$.

16. The manufacturing method as claimed in claim 15, wherein the concentration of $HNO_3$ is 4–10% and the concentration of $(NH_4)_2Ce(NO_3)_6$ is 10–15%.

17. The manufacturing method as claimed in claim 14, wherein the doped amorphous silicon layer is dry etched by using a gas consisting of a hydrogen halide and at least one selected from the group consisting of $CF_4$, $CHF_3$, $CHClF_2$, $CH_3F$ and $C_2F_6$.

18. A method of manufacturing a thin film transistor panel for display, comprising:

forming a gate line having a dual-layered structure and tapered edges at an angle of 20~70 degrees on a substrate;

depositing a gate insulating layer;

forming an un-doped amorphous silicon layer and a doped amorphous silicon layer;

forming a data line, a source electrode and a drain electrode;

forming a passivation layer;

depositing a transparent conductive layer on the passivation layer; and etching the transparent conductive layer to form a gate conductive layer connected to an end portion of the gate line, a data conductive layer connected to an end portion of the data line, and a pixel electrode connected to the drain electrode.

19. The manufacturing method as claimed in claim 18, wherein the dual-layered structure consists of two selected from the group consisting of Al, Al alloy and MoW alloy.

20. The manufacturing method as claimed in claim 18, wherein the passivation layer contacts a portion of the un-doped amorphous silicon layer.

21. The manufacturing method as claimed in claim 20, wherein the dual-layered structure consists of two selected from the group consisting of Al, Al alloy and MoW alloy.

22. The manufacturing method as claimed in claim 21, wherein an upper layer of the dual-layered structure is made of Al or Al alloy.

23. The manufacturing method as claimed in claim 20, wherein a lower layer of the dual-layered structure is made of MoW alloy.

* * * * *